United States Patent
Steele et al.

(10) Patent No.: US 10,634,288 B2
(45) Date of Patent: Apr. 28, 2020

(54) SOLID STATE LAMP USING LIGHT EMITTING STRIPS

(71) Applicant: Quarkstar LLC, Las Vegas, NV (US)

(72) Inventors: Robert V. Steele, Redwood City, CA (US); Louis Lerman, Las Vegas, NV (US); Allan Brent York, Fort Langley (CA); Wilson Dau, Victoria (CA); Jacqueline Teng, Irvine, CA (US); George Lerman, Las Vegas, NV (US)

(73) Assignee: Quarkstar LLC, Las Vegas, NV (US)

( * ) Notice: Subject to any disclaimer, the term of this patent is extended or adjusted under 35 U.S.C. 154(b) by 0 days.

(21) Appl. No.: 16/525,452

(22) Filed: Jul. 29, 2019

(65) Prior Publication Data
US 2019/0346085 A1 Nov. 14, 2019

Related U.S. Application Data

(63) Continuation of application No. 16/380,858, filed on Apr. 10, 2019, which is a continuation of application
(Continued)

(51) Int. Cl.
*F21K 9/237* (2016.01)
*F21V 29/83* (2015.01)
(Continued)

(52) U.S. Cl.
CPC .............. *F21K 9/237* (2016.08); *F21K 9/23* (2016.08); *F21K 9/232* (2016.08); *F21K 9/235* (2016.08);
(Continued)

(58) Field of Classification Search
None
See application file for complete search history.

(56) References Cited

U.S. PATENT DOCUMENTS

| 2,626,120 A | 1/1953 | Baker |
| 2,733,367 A | 1/1956 | Gillson, Jr. |

(Continued)

FOREIGN PATENT DOCUMENTS

| CN | 101232061 A1 | 7/2008 |
| CN | 101968181 A1 | 2/2011 |

(Continued)

OTHER PUBLICATIONS http://www.electronicproducts.com/Optoelectronics/Lamps_and_Bulbs/LEE_lamps_mimic_incandescent_filaments.aspx, "LED lamps mimic incandescent filaments", Ushio America, Electronic Products, May 21, 2010.

(Continued)

*Primary Examiner* — Elmito Breval
(74) *Attorney, Agent, or Firm* — Fish & Richardson P.C.

(57) ABSTRACT

In one embodiment, an LED lamp has a generally bulb shape. The LEDs are low power types and are encapsulated in thin, narrow, flexible strips. The LEDs are connected in series in the strips to drop a desired voltage. The strips are affixed to the outer surface of a bulb form to provide structure to the lamp. The strips are connected in parallel to a power supply, which may be housed in the lamp. Since many low power LEDs are used and are spread out over a large surface area, there is no need for a large metal heat sink. Further, the light emission is similar to that of an incandescent bulb. In other embodiment, there is no bulb form and the strips are bendable to have a variety of shapes. In another embodiment, a light sheet is bent to provide 360 degrees of light emission. Many other embodiments are described.

21 Claims, 11 Drawing Sheets

Related U.S. Application Data

No. 15/417,037, filed on Jan. 26, 2017, now Pat. No. 10,288,229, which is a continuation of application No. 14/929,147, filed on Oct. 30, 2015, now Pat. No. 9,557,018, which is a continuation of application No. 14/334,067, filed on Jul. 17, 2014, now abandoned, which is a continuation of application No. 13/681,099, filed on Nov. 19, 2012, now Pat. No. 8,791,640, which is a continuation of application No. 13/032,502, filed on Feb. 22, 2011, now Pat. No. 8,314,566.

(51) Int. Cl.

| | | |
|---|---|---|
| F21K 9/23 | (2016.01) | |
| F21K 9/232 | (2016.01) | |
| F21K 9/64 | (2016.01) | |
| F21K 9/65 | (2016.01) | |
| F21S 4/20 | (2016.01) | |
| F21V 7/00 | (2006.01) | |
| F21V 9/00 | (2018.01) | |
| F21V 21/00 | (2006.01) | |
| F21V 29/10 | (2015.01) | |
| F21V 17/12 | (2006.01) | |
| F21V 17/14 | (2006.01) | |
| F21V 19/00 | (2006.01) | |
| F21V 23/06 | (2006.01) | |
| F21K 9/60 | (2016.01) | |
| F21K 9/238 | (2016.01) | |
| F21K 9/235 | (2016.01) | |
| F21V 9/30 | (2018.01) | |
| F21V 3/02 | (2006.01) | |
| F21V 7/06 | (2006.01) | |
| F21V 23/02 | (2006.01) | |
| H01L 25/075 | (2006.01) | |
| H01L 33/62 | (2010.01) | |
| F21V 29/505 | (2015.01) | |
| F21Y 105/00 | (2016.01) | |
| F21K 9/233 | (2016.01) | |
| F21Y 103/10 | (2016.01) | |
| F21Y 115/10 | (2016.01) | |
| F21Y 115/15 | (2016.01) | |
| F21Y 107/00 | (2016.01) | |
| F21Y 107/20 | (2016.01) | |
| F21Y 107/30 | (2016.01) | |
| F21Y 107/90 | (2016.01) | |
| F21V 3/00 | (2015.01) | |
| F21Y 101/00 | (2016.01) | |

(52) U.S. Cl.
CPC ............... *F21K 9/238* (2016.08); *F21K 9/60* (2016.08); *F21K 9/64* (2016.08); *F21K 9/65* (2016.08); *F21S 4/20* (2016.01); *F21V 3/02* (2013.01); *F21V 7/00* (2013.01); *F21V 7/06* (2013.01); *F21V 9/00* (2013.01); *F21V 9/30* (2018.02); *F21V 17/12* (2013.01); *F21V 17/14* (2013.01); *F21V 19/0025* (2013.01); *F21V 21/00* (2013.01); *F21V 23/02* (2013.01); *F21V 23/06* (2013.01); *F21V 29/10* (2015.01); *F21V 29/83* (2015.01); *F21K 9/233* (2016.08); *F21V 3/00* (2013.01); *F21V 29/505* (2015.01); *F21Y 2101/00* (2013.01); *F21Y 2103/10* (2016.08); *F21Y 2105/00* (2013.01); *F21Y 2107/00* (2016.08); *F21Y 2107/20* (2016.08); *F21Y 2107/30* (2016.08); *F21Y 2107/90* (2016.08); *F21Y 2115/10* (2016.08); *F21Y 2115/15* (2016.08); *H01L 25/0753* (2013.01); *H01L 33/62* (2013.01); *H01L 2924/0002* (2013.01)

(56) References Cited

U.S. PATENT DOCUMENTS

| | | |
|---|---|---|
| 4,358,817 A | 11/1982 | Bielemeier |
| 4,445,132 A | 4/1984 | Ichikawa |
| 5,036,442 A | 7/1991 | Brown |
| 5,469,020 A | 11/1995 | Herrick |
| 5,868,489 A | 2/1999 | Fuller |
| 5,884,994 A | 3/1999 | Herst |
| 5,925,897 A | 7/1999 | Oberman |
| 6,087,680 A | 7/2000 | Gramann |
| 6,113,433 A | 9/2000 | Al-Turki |
| 6,241,369 B1 | 6/2001 | Mackiewicz |
| 6,270,236 B1 | 8/2001 | Brussog |
| 6,540,373 B2 | 4/2003 | Bailey |
| 6,541,908 B1 | 4/2003 | Cheung |
| 6,557,393 B1 | 5/2003 | Gokhfeld |
| 6,614,056 B1 | 9/2003 | Tarsa |
| 6,657,236 B1 | 12/2003 | Thibeault |
| 6,693,551 B2 | 2/2004 | Pederson |
| 6,786,621 B2 | 9/2004 | Sviland |
| 6,821,804 B2 | 11/2004 | Thibeault et al. |
| 6,876,143 B2 | 4/2005 | Daniels |
| 6,876,149 B2 | 4/2005 | Miyashita |
| 6,880,963 B2 | 4/2005 | Luig |
| 6,885,036 B2 | 4/2005 | Tarsa |
| 6,936,855 B1 | 8/2005 | Harrah |
| 7,052,924 B2 | 5/2006 | Daniels |
| 7,071,493 B2 | 7/2006 | Owen et al. |
| 7,217,956 B2 | 5/2007 | Daniels |
| 7,259,030 B2 | 8/2007 | Daniels |
| 7,312,474 B2 | 12/2007 | Emerson |
| 7,378,124 B2 | 5/2008 | Daniels |
| 7,404,652 B2 | 7/2008 | Ng et al. |
| 7,427,782 B2 | 9/2008 | Daniels |
| 7,434,951 B2 | 10/2008 | Bienick |
| 7,476,557 B2 | 1/2009 | Daniels |
| 7,564,180 B2 | 7/2009 | Brandes |
| 7,604,377 B2 | 10/2009 | Yu |
| 7,609,006 B2 | 10/2009 | Gibboney |
| 7,745,838 B2 | 6/2010 | Lefevre |
| 7,777,166 B2 | 8/2010 | Roberts |
| 7,799,699 B2 | 9/2010 | Nuzzo et al. |
| 7,858,994 B2 | 12/2010 | Daniels |
| 7,952,107 B2 | 5/2011 | Daniels |
| 7,976,187 B2 | 7/2011 | Villard |
| 8,006,453 B2 | 8/2011 | Anderson |
| 8,039,850 B2 | 10/2011 | Lee et al. |
| 8,044,415 B2 | 10/2011 | Messere |
| 8,058,659 B2 | 11/2011 | Bisberg |
| 8,066,407 B2 | 11/2011 | Remus |
| 8,154,033 B2 | 4/2012 | Lin |
| 8,167,677 B2 | 5/2012 | Huang |
| 8,192,051 B2 | 6/2012 | Dau |
| 8,193,721 B2 | 6/2012 | Cho et al. |
| 8,210,716 B2 | 7/2012 | Lerman et al. |
| 8,226,266 B2 | 7/2012 | Chiang |
| 8,227,822 B2 | 7/2012 | Hung et al. |
| 8,227,999 B2 | 7/2012 | Van |
| 8,231,258 B2 | 7/2012 | Kim |
| 8,256,151 B2 | 9/2012 | Stafford |
| 8,338,199 B2 | 12/2012 | Lerman |
| 8,338,849 B2 | 12/2012 | Tischler |
| 8,343,571 B2 | 1/2013 | Werners et al. |
| 8,366,295 B2 | 2/2013 | Tanda |
| 8,400,051 B2 | 3/2013 | Hakata et al. |
| 8,408,748 B2 | 4/2013 | Janik |
| 8,410,726 B2 | 4/2013 | Dau |
| 8,414,154 B2 | 4/2013 | Dau |
| 8,445,936 B1 | 5/2013 | Hwu |
| 8,461,602 B2 | 6/2013 | Lerman |
| 8,502,239 B2 | 8/2013 | Lin |
| 8,591,057 B2 | 11/2013 | Kawabata et al. |
| 8,596,819 B2 | 12/2013 | Negley |
| 8,628,214 B2 | 1/2014 | Negley |
| 8,632,196 B2 | 1/2014 | Tong |
| 8,740,407 B2 | 6/2014 | Kotovsky |
| 8,766,298 B2 | 7/2014 | Hussell |

(56) References Cited

U.S. PATENT DOCUMENTS

| | | |
|---|---|---|
| 8,773,007 B2 | 7/2014 | Van |
| 8,882,284 B2 | 11/2014 | Tong |
| 8,882,290 B2 | 11/2014 | Hsieh et al. |
| 8,931,933 B2 | 1/2015 | Tong |
| 8,960,989 B2 | 2/2015 | Van de Ven |
| 9,016,901 B2 | 4/2015 | Janik |
| 9,024,517 B2 | 5/2015 | Yuan |
| 9,062,830 B2 | 6/2015 | Le |
| 9,175,811 B2 | 11/2015 | Van de Ven |
| 9,222,654 B2 | 12/2015 | Boyer |
| 9,230,943 B2 | 1/2016 | Harbers et al. |
| 9,243,758 B2 | 1/2016 | Pickard |
| 9,275,979 B2 | 3/2016 | Tong |
| 9,310,030 B2 | 4/2016 | Tong |
| 9,316,361 B2 | 4/2016 | Tong |
| 2002/0149933 A1 | 10/2002 | Archer |
| 2003/0031015 A1 | 2/2003 | Ishibashi |
| 2003/0137839 A1 | 7/2003 | Lin |
| 2003/0160256 A1 | 8/2003 | Durocher |
| 2004/0189218 A1 | 9/2004 | Leong |
| 2004/0223328 A1 | 11/2004 | Lee |
| 2004/0257803 A1 | 12/2004 | Kermoade |
| 2005/0174769 A1 | 8/2005 | Yong |
| 2005/0199899 A1 | 9/2005 | Lin et al. |
| 2005/0207152 A1 | 9/2005 | Maxik |
| 2005/0207156 A1 | 9/2005 | Wang |
| 2005/0214963 A1 | 9/2005 | Daniels et al. |
| 2005/0224828 A1 | 10/2005 | Oon et al. |
| 2005/0265024 A1 | 12/2005 | Luk |
| 2006/0098444 A1 | 5/2006 | Petruzzi |
| 2006/0152931 A1 | 7/2006 | Holman |
| 2006/0157724 A1 | 7/2006 | Fujita |
| 2006/0180828 A1 | 8/2006 | Kim et al. |
| 2006/0193130 A1 | 8/2006 | Ishibashi |
| 2006/0221606 A1 | 10/2006 | Dowling |
| 2007/0001188 A1 | 1/2007 | Lee |
| 2007/0090387 A1 | 4/2007 | Daniels |
| 2007/0103066 A1 | 5/2007 | D Andrade |
| 2007/0126354 A1 | 6/2007 | Chao |
| 2007/0139949 A1 | 6/2007 | Tanda et al. |
| 2007/0228999 A1 | 10/2007 | Kit |
| 2007/0241355 A1 | 10/2007 | Chua |
| 2007/0280593 A1 | 12/2007 | Brychell |
| 2007/0290217 A1 | 12/2007 | Daniels |
| 2008/0079012 A1 | 4/2008 | Grote |
| 2008/0080163 A1 | 4/2008 | Grote |
| 2008/0080200 A1 | 4/2008 | Robbins |
| 2008/0089069 A1 | 4/2008 | Medendorp |
| 2008/0179602 A1 | 7/2008 | Negley |
| 2008/0194054 A1 | 8/2008 | Lin et al. |
| 2008/0238338 A1 | 10/2008 | Latham |
| 2008/0238649 A1 | 10/2008 | Arszman |
| 2008/0259600 A1 | 10/2008 | Pohlert et al. |
| 2008/0297071 A1 | 12/2008 | Ray et al. |
| 2008/0309257 A1 | 12/2008 | Hickey |
| 2009/0046457 A1 | 2/2009 | Everhart |
| 2009/0086508 A1 | 4/2009 | Bierhuizen |
| 2009/0108268 A1 | 4/2009 | Sung |
| 2009/0114928 A1 | 5/2009 | Messere |
| 2009/0195787 A1 | 8/2009 | Granados |
| 2009/0237916 A1 | 9/2009 | Park |
| 2009/0261357 A1 | 10/2009 | Daniels |
| 2009/0261743 A1 | 10/2009 | Chen |
| 2009/0302730 A1 | 12/2009 | Carroll |
| 2010/0044589 A1 | 2/2010 | Garcia |
| 2010/0096977 A1 | 4/2010 | Lee |
| 2010/0097798 A1 | 4/2010 | Young |
| 2010/0102729 A1 | 4/2010 | Katzir |
| 2010/0128478 A1 | 5/2010 | Anderson |
| 2010/0164344 A1 | 7/2010 | Boemer |
| 2010/0220046 A1 | 9/2010 | Ploetz |
| 2010/0308353 A1 | 12/2010 | Grabowski |
| 2010/0317132 A1 | 12/2010 | Rogers |
| 2011/0026253 A1 | 2/2011 | Gill |
| 2011/0050073 A1 | 3/2011 | Huang |
| 2011/0058372 A1 | 3/2011 | Lerman et al. |
| 2011/0068698 A1 | 3/2011 | Swoboda |
| 2011/0069487 A1 | 3/2011 | Ng |
| 2011/0074296 A1 | 3/2011 | Shen et al. |
| 2011/0089838 A1 | 4/2011 | Pickard |
| 2011/0103055 A1 | 5/2011 | Carroll |
| 2011/0103067 A1 | 5/2011 | Ago |
| 2011/0133658 A1 | 6/2011 | Sauerlaender |
| 2011/0163683 A1 | 7/2011 | Steele et al. |
| 2011/0170288 A1 | 7/2011 | Kim |
| 2011/0180818 A1 | 7/2011 | Lerman |
| 2011/0204020 A1 | 8/2011 | Ray et al. |
| 2011/0215697 A1 | 9/2011 | Tong |
| 2011/0234109 A1 | 9/2011 | Chiu |
| 2011/0260741 A1 | 10/2011 | Weaver |
| 2011/0267560 A1 | 11/2011 | Usukura |
| 2011/0298371 A1 | 12/2011 | Brandes |
| 2012/0043552 A1 | 2/2012 | David et al. |
| 2012/0161626 A1 | 6/2012 | Van de Ven |
| 2012/0217862 A1 | 8/2012 | Matsuda |
| 2012/0235181 A1 | 9/2012 | Matsuda |
| 2013/0058080 A1 | 3/2013 | Ge et al. |
| 2013/0064260 A1 | 3/2013 | Tanda |
| 2013/0141892 A1 | 6/2013 | Okazaki |
| 2013/0147348 A1 | 6/2013 | Motoya |
| 2013/0155683 A1 | 6/2013 | Matsuda |
| 2013/0223073 A1 | 8/2013 | Hayashi |
| 2013/0328088 A1 | 12/2013 | Morikawa |
| 2014/0071671 A1 | 3/2014 | Tseng |
| 2014/0211457 A1 | 7/2014 | Tarsa |
| 2014/0268698 A1 | 9/2014 | Zimmerman |
| 2014/0328052 A1 | 11/2014 | Hochman |

FOREIGN PATENT DOCUMENTS

| | | |
|---|---|---|
| DE | 10315417 A1 | 11/2004 |
| DE | 202010005863 A1 | 9/2010 |
| EP | 2159780 A1 | 3/2010 |
| JP | 61198690 A1 | 9/1986 |
| JP | 8018105 A1 | 1/1996 |
| WO | WO2005090852 A1 | 9/2005 |
| WO | WO2005099310 A1 | 10/2005 |
| WO | WO2007149362 A1 | 12/2007 |
| WO | WO2009063655 A1 | 5/2009 |
| WO | WO2009149263 A1 | 12/2009 |
| WO | WO2011082497 A1 | 7/2011 |
| WO | WO2011100193 A1 | 8/2011 |
| WO | WO2013116631 A1 | 8/2013 |

OTHER PUBLICATIONS http://techon.nikkeibp.co.jp/english/NEWS_EN/20090106/163635, Yousuke Ogasawara, Nikkei Electronics, "Ushio Lighting Releases Light Bulbs with LED Filaments", Jan. 7, 2009.

English translation of Japanese Patent No. JP08-018105. 12 pages.

English translation of Japanese Patent No. JP61-198690, 11 pages.

"A Breakthrough in LED Technology," Lightsheet™ versus the other LED Manufacturing Technology, Lightsheet, Articulux, Articulated Technologies web page downloaded on Aug. 27, 2010 from http://www.buylightsheet.com/how.html, 1 page.

"Competitive Advantage of Lightsheet™ Technology," Articulated Technologies white paper, Oct. 2008, 4 pages.

"Why pay for the lamp when you just need the light?," Lightsheet, Articulux, Articulated Technologies web page downloaded on Aug. 27, 2010 from http://www.buylightsheet.com/, 1 page.

LED Bulb with 5W Power Consumption. product description, downloaded on Nov. 22, 2010 from http://www.best-b2b.com/Products/867/890-2/led-bulb-with-5w-power-consumption_417 . . . pp. 1-2.

James Gourlay et al., "74.2: High Efficiency Hybrid LED Backlight for Large-area LCD TF," 2010 SID Digest, pp. 1097-1099.

James Gourlay et al., "79.4: Light-Rolls: High Throughput Manufacture for LED Lighting and Displays," SID 2010 Digest, pp. 1184-1187.

S. W. Rickly Lee et al., "Process Development and Prototyping for the Assembly of LED Arrays on Flexible Printed Circuit Tape for

(56) References Cited

OTHER PUBLICATIONS

General Solid State Lighting," 2009 IEEE, 2009 Electronic Components and Technology Conference, pp. 2137-2142.

Louis Lerman et al., "Solid State Light Sheet Using Thin LEDs for General Illumination", U.S. Appl. No. 13/018,330, filed Jan. 31, 2011, 89 pages.

Konstantinos A. Sierros et al., "59.2: Durable Solid State Flexible LED Devices," SID 2010 Digest, pp. 882-885.

Schulz, International Search Report and Written Opinion in PCT/US2012/025730 dated May 29, 2012, 10 pages.

Vergoosen, Invitation to Pay Additional Fees in PCT/US2011/049233 dated Dec. 22, 2011, 7 pages.

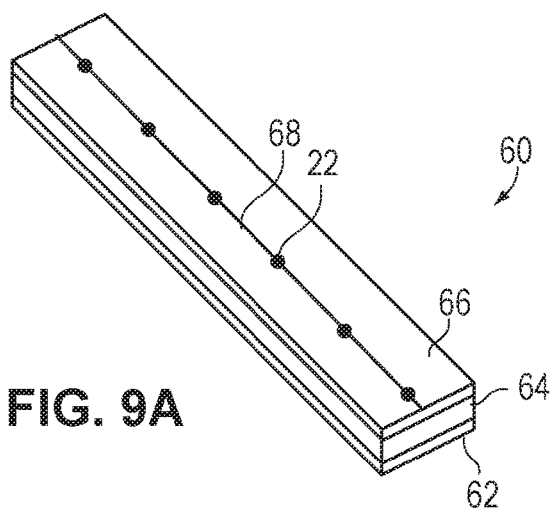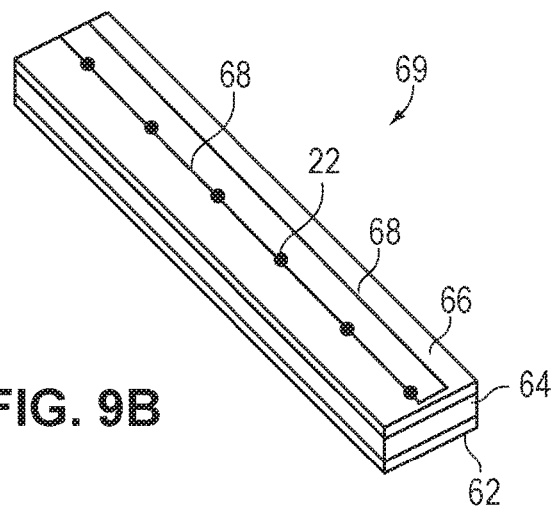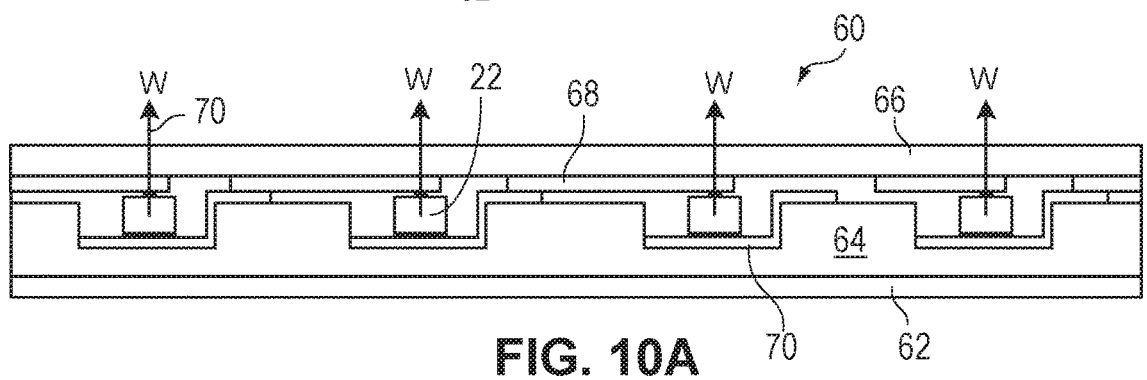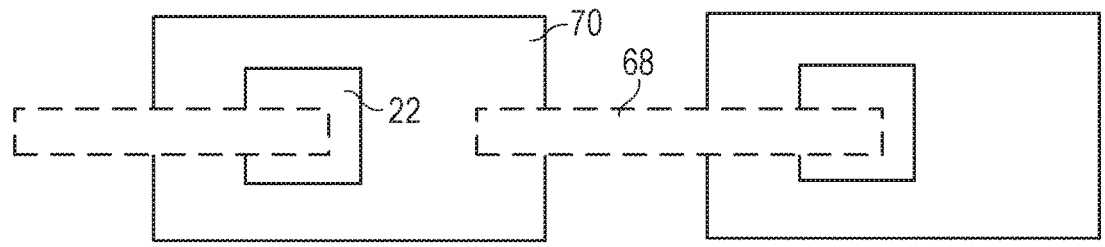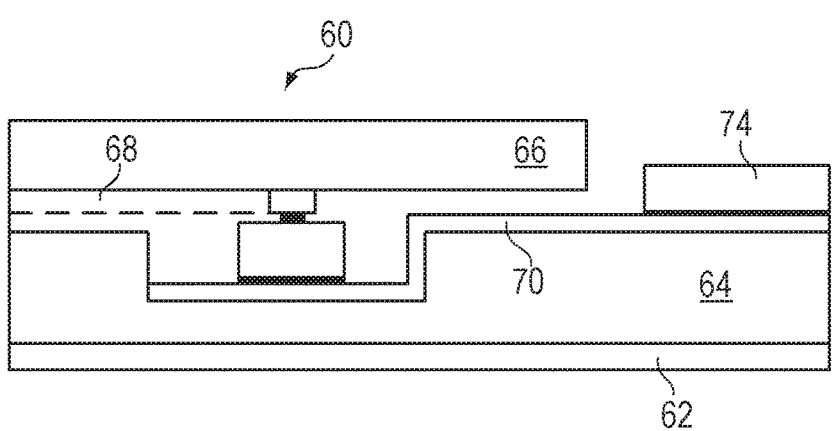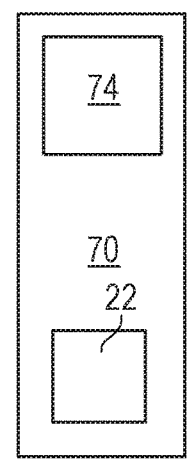

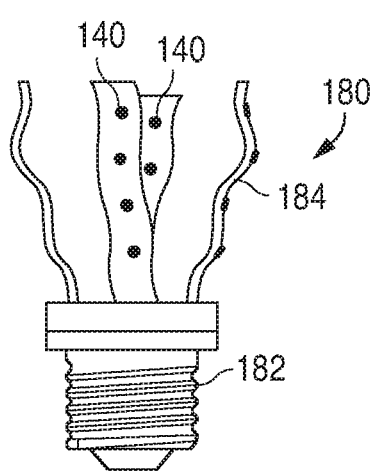
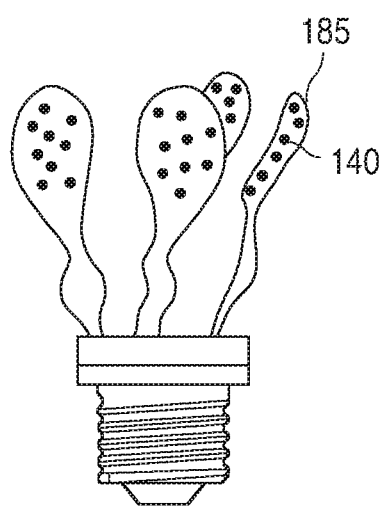
FIG. 21A    FIG. 21B
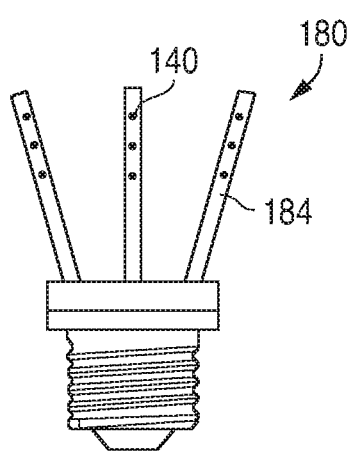
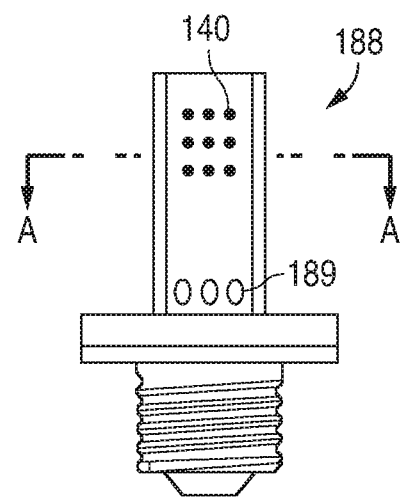
FIG. 22    FIG. 23A
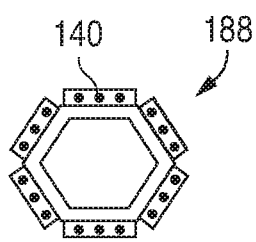
FIG. 23B

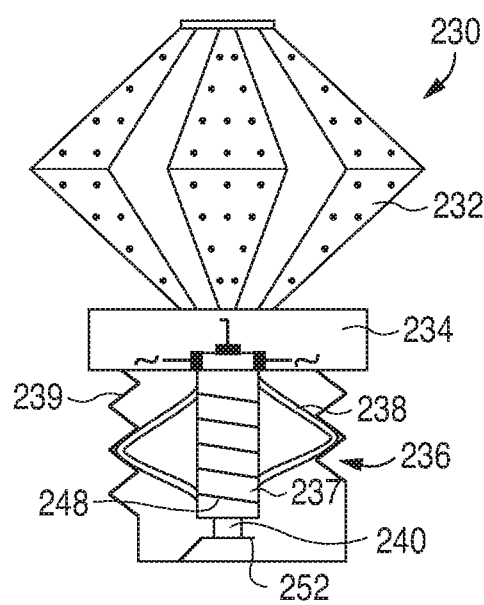
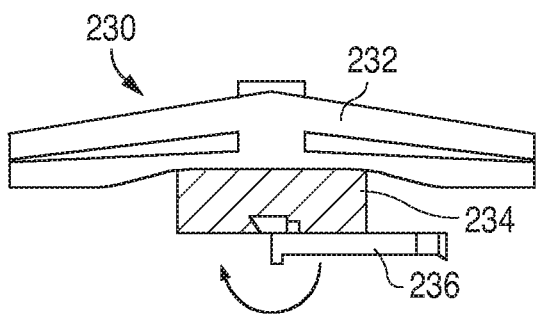
FIG. 27
FIG. 28
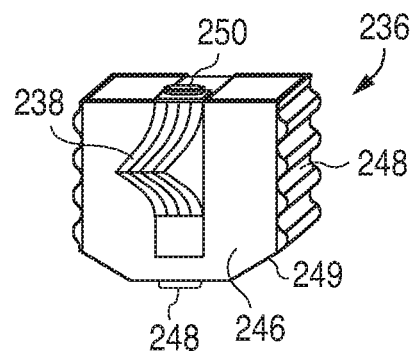
FIG. 29A
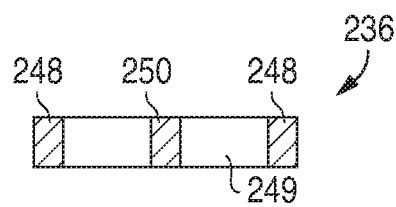
FIG. 29B
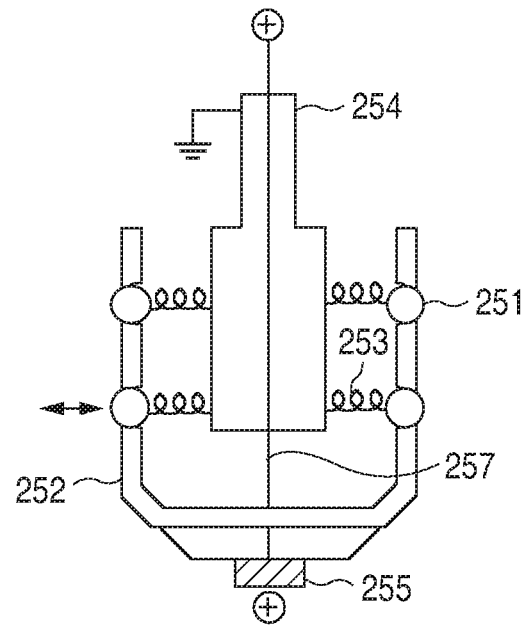
FIG. 29C
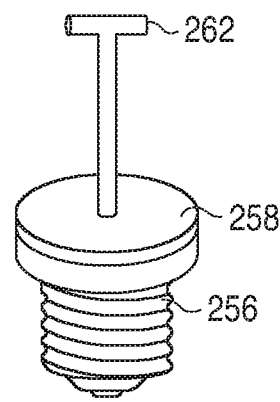
FIG. 30

SOLID STATE LAMP USING LIGHT EMITTING STRIPS

CLAIM OF PRIORITY

This application is a continuation application and claims priority under 35 U.S.C. § 120 to U.S. application Ser. No. 16/380,858, filed Apr. 10, 2019, which is a continuation of U.S. application Ser. No. 15/417,037, filed Jan. 26, 2017, which is a continuation of U.S. application Ser. No. 14/929,147, filed Oct. 30, 2015, which is a continuation of U.S. application Ser. No. 14/334,067, filed Jul. 17, 2014, which is a continuation of U.S. application Ser. No. 13/681,099, filed Nov. 19, 2012, which is a continuation of U.S. application Ser. No. 13/032,502, filed Feb. 22, 2011, the entire contents of which are incorporated herein by reference.

FIELD OF THE INVENTION

This invention relates to a solid state lamp, such as a lamp using light emitting diodes (LEDs), and, in particular, to a solid state lamp that requires relatively little cooling.

BACKGROUND

A huge market for LEDs is in replacement lamps for standard, screw-in incandescent light bulbs, commonly referred to as A19 bulbs, or less formally, A-lamps. The letter "A" refers to the general shape of the bulb, including its base, and the number 19 refers to the maximum diameter of the bulb in eighths of an inch (e.g., 2⅜" diameter). Such a form factor is also specified in ANSI C78-20-2003. Therefore, it is desirable to provide an LED lamp that has the same screw-in base as a standard light bulb and approximately the same size diameter or less. Additional markets exist for replacing other types of standard incandescent bulbs with longer lasting and more energy efficient solid state lamps.

Typical LED lamps having an A-shape use high power LEDs in order to use as few LEDs as possible to achieve the desired lumen output (e.g., 600-1000 lumens). Such LEDs may each draw a current greater than 300 mA and dissipate 1 W or more. Since the LED dies are on the order of about 1 mm$^2$, adequate heat removal is difficult because the heat is usually highly concentrated within a small surface area and often located near the base of the lamp where it shares heat dissipation capacity with the power supply electronics. The high power LED junction temperatures should be kept under 125° C. to ensure the LEDs remain efficient and have a long life. A common design is to mount high power LEDs on a flat, heat conductive substrate and provide a diffusive bulb-shaped envelope around the substrate. The power supply is in the body of the lamp. Removing heat from such designs, using ambient air currents, is difficult since the lamp may be mounted in any orientation. Metal fins or heavy metal heat sinks are common ways to remove heat from such lamps, but such heat sinks add significant cost and have other drawbacks. It is common for such LED replacement lamps to cost $30-$60. Additionally, the light emission produced by such a solid state bulb is unlike that of an incandescent bulb since all the LEDs are mounted on a relatively small flat substrate. This departure from the standard spherical distribution patterns for conventional lamps that are replaced with LED replacement lamps is of particularly concern to the industry and end users, since their existing luminaires are often adapted to spherical light emission patterns. When presented with the typical "hemi-spherical" type emission from many standard LED replacement lamps, there are often annoying shadow lines in shades and strong variations in up/down flux ratios which can affect the proper photometric distributions.

What is needed is a new approach for a solid state lamp that replaces a variety of standard incandescent lamps, using standard electrical connectors and supply voltages, where removing adequate heat does not require significant cost or added weight and where other drawbacks of prior art solid state lamps are overcome.

SUMMARY

In one embodiment, a solid state lamp has a generally bulb shape, such as a standard A19 shape. Many other form factors are envisioned.

The light source comprises an array of flexible LED strips, where each strip encapsulates a string of low power (e.g., 20 mA), bare LED dies without wire bonds. The strips are affixed to the outside of a bulb form, which may be clear plastic, a metal mesh, or other suitable material. The strips are thin, allowing heat to be transferred through the surface of the strips to ambient air. An optional thin protective layer over the strips would also transmit heat to the ambient air. Further, the strips are spaced apart from each other to expose the bulb form to ambient air, allowing heat absorbed by the underlying bulb form to be dissipated. Therefore, there is a low heat-producing large surface area contacted by ambient air. There may be openings in the bulb form for air circulation within the bulb form. The strips can be bent to accommodate any form factor, such as an A-shape bulb.

In one embodiment, the strips are only a few millimeters wide and are arranged extending from the lamp's base to the apex of the bulb form.

In another embodiment, the strips are affixed around the perimeter of the bulb form either in a spiral pattern or with parallel strips. Other patterns of the strips are envisioned.

In one embodiment, to replace a 60 W incandescent bulb, there are 12 LED strips affixed to a bulb form, each strip having 12 LEDs in series for generating a total of 800-900 lumens. The 12 strips are driven in parallel. The LEDs may be driven at a low current so as to generate very little heat, and are spread out over a relatively large bulb surface, enabling efficient cooling by ambient air. By driving the LEDs at lower localized current density, it is also possible to significantly enhance the overall efficacy of the LED by as much as 30% which delivers significant energy savings when compared to the large LED chip type lamps that are in the market.

By using unpackaged LED dies in the strips, and using traces in the strips to connect the dies in series, the cost of each strip is very low. Using bare LED dies in the strips, compared to packaged LEDs, reduces the cost per LED by 90% or more, since packaging of LED chips to mount them in a sealed surface mount package is by far the largest contributor to an LED's cost.

White light may be created by using blue LEDs in conjunction with a phosphor or combinations of phosphors or other light converting materials in either proximate or remote configurations. Light emitting dies other than LEDs may also be used, such as laser diodes.

Many other lamp structures are envisioned. For example, the strips may have sufficient mechanical integrity to not require being affixed to a rigid form. In one embodiment, a plurality of strips extends from a base and the strips are bendable by the user to have any shape and to produce a customized light emission pattern. In another embodiment, a flexible transparent substrate encapsulating the light emitting dies is formed as a sheet and is bent to form a cylinder or other shape to replace a standard incandescent light bulb.

In another embodiment, the solid state lamp is compressible for storage or shipping and expandable to various heights and configurations by the user.

To provide a consistent overall color temperature using LEDs from a variety of bins, the strips may be tested for color temperature and combined in a single lamp to achieve the desired overall color temperature when the light output from the plurality of strips is merged.

Dynamic feedback is used in one embodiment to energize redundant strips in the event another strip has failed. The currents through the various strips may be detected to determine that a strip has failed. In a related embodiment, the currents are monitored to determine an increase in current, indicating that one or more LEDs in the strip are becoming too hot and are drawing more current. The heated strips are then controlled to have a reduced duty cycle to cool them, while the duty cycle of one or more other strips is increased to offset the reduction in flux.

Many other embodiments are described.

BRIEF DESCRIPTION OF THE DRAWINGS

FIG. 9A is a perspective view of a portion of an LED strip that can be used in the various lamps. All strips described herein can instead be formed as sheets of encapsulated bare LEDs connected in combinations of serial and parallel.

FIG. 9B illustrates the LED strip of FIG. 9A where the substrate conductors terminate at only one end of the strip.

FIG. 10A is a cross-sectional view of a portion of an LED strip or sheet, where the LEDs are connected in series.

FIG. 10B is a magnified top down view of FIG. 9A showing how the LEDs are connected in series by conducting traces on the substrates sandwiching the bare LEDs.

FIG. 11A is a cross-sectional view of the end of an LED strip or sheet showing how the metal leads of the strip or sheet can be exposed for attachment to a power supply terminal.

FIG. 11B is a top down view of the end of the LED strip or sheet of FIG. 10A showing a termination pad of the strip.

FIG. 21A illustrates a solid state lamp where the LED strips are bendable to create a custom light emission pattern.

FIG. 21B illustrates a solid state lamp where the LED strips broaden near the "light center" of the lamp and concentrate more light emission.

FIG. 22 is similar to FIG. 21A, where the LED strips are straight but could be fixed or able to be bent at various angles.

FIG. 23A illustrates a solid state lamp formed of a single LED sheet or a plurality of LED strips, where the sheet or strips are configured to create a polygonal cross-section.

FIG. 23B is a cross-sectional view of FIG. 23A along line A-A in FIG. 23A.

FIG. 27 illustrates a solid state lamp that is compressible for packaging.

FIG. 28 is a bisected view of FIG. 27 in its compressed state, with the screw-in type electrical connector in its stored position.

FIG. 29A is a perspective view of the electrical connector of FIG. 28 in its down position.

FIG. 29B is a top down view of the electrical connector of FIG. 29A.

FIG. 29C is a cross-sectional view of a push-in connector for an Edison-type screw-in socket.

FIG. 30 illustrates an electrical connector affixed to a handle to provide torque for screwing a solid state lamp into a socket.

FIG. 40 is also used to illustrate other active controls for the LED strips.

Elements that are the same or similar in the various figures are identified with the same numeral.

DETAILED DESCRIPTION

Figure 1:
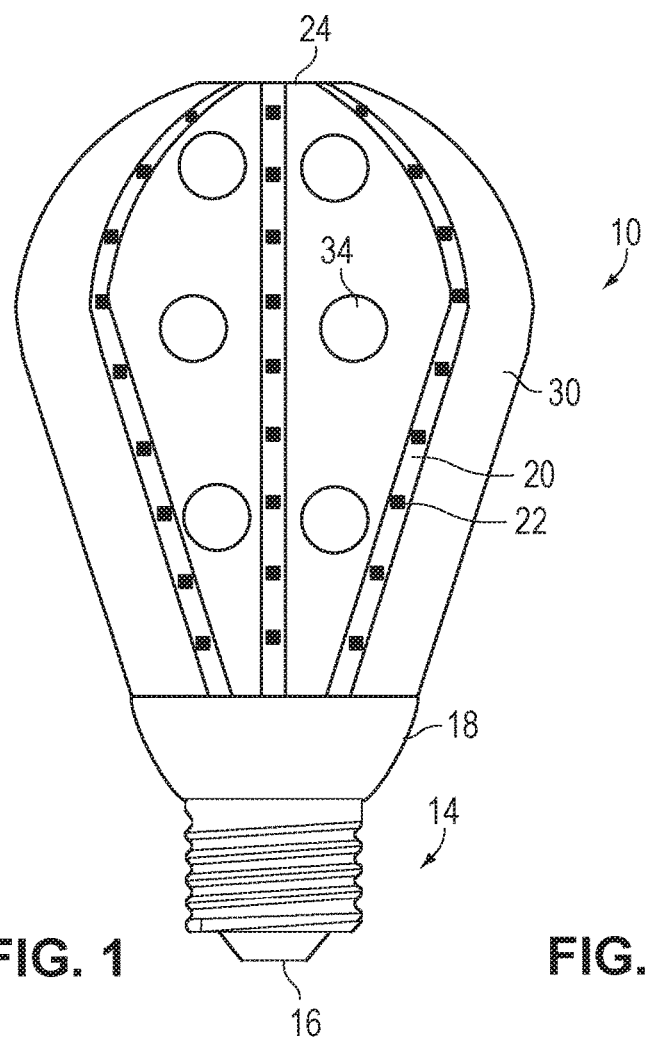
FIG. 1 is side view of a solid state lamp, using a plurality of LED strips, in accordance with one embodiment of the invention.

FIG. 1 illustrates one embodiment of a solid state lamp 10 having an A19 form factor to be used as a direct replacement of conventional light bulbs. The lamp 10 can have other form factors, such as being substantially spherical.

The lamp 10 has a standard screw-in base 14. The threaded portion of the base 14 typically contacts a neutral (or grounded) terminal of a socket connected to a mains voltage supply. The light fixture socket provides some heat sinking for at least the internal AC/DC power supply. The bottom terminal 16 of the base 14 contacts the "hot" terminal of the socket. A top portion 18 of the base 14 houses at least a portion of a driver for the various LED strips 20.

The LED strips 20 will be described in further detail later. In one embodiment, each LED strip 20 contains 12 low power LEDs 22 connected in series so as to drop approximately 30-40 volts, depending on the type of LEDs used. Other numbers and types of LEDs may be used.

In one embodiment, for replacing a 60 W incandescent bulb, there are 12 LED strips 20, each having 12 LEDs 22 connected in series for generating a total of 800-900 lumens. Each strip 20 extends from a connection terminal (e.g., a common terminal or current source terminal) near the base 14 of the lamp 10 to a top electrical termination pad 24 so the LEDs 22 are spread over the entire length of the lamp (3-4 inches from base to apex). The 12 strips 20 are driven in parallel, parallel/series, or even variably switched by an electrical interface to the mains power that is contained within the lamp. Each LED 22 may be driven at the relatively low current of about 20 mA so as to generate very little heat. Since many LEDs (e.g., 144) are spread out over a relatively large bulb surface, the heat is not concentrated, enabling efficient cooling by ambient air. Each strip 20 may be less than 5 mm wide and less than 2 mm thick. In another embodiment the strips are only electrically connected at either the top or the bottom end, and the LEDs can be driven in any of either series, parallel, or series and parallel configurations with the electrical supply terminations on either of one or both ends or sides. The conductor terminations may occur at any location along the sides or even terminate at an opening along the strip.

The strips 20 are affixed, such as with silicone or epoxy or thermal bonding, to a bulb form 30, which may be virtually any material. Since there may be some backscatter from the strips 20, it is preferable that the bulb form 30 be clear, such as molded transparent plastic, or reflective, such as reflective layer coated plastic or diffuse reflecting plastic. To provide an air flow inside the bulb form 30 for removing heat, the bulb form 30 may be provided with openings 34, which may be holes, slits, or other opening shapes.

In another embodiment, the bulb form is a metal mesh for improved air flow.

In another embodiment, the bulb form may be created by the length and bending radius of the strips 20 between the termination pad 24 and the driver. This results in a lower cost lamp with increased air flow around all sides of the LED strips 20. It may also be advantageous to affix each the strips 20 to a separate reinforcing backplane, which may be made of copper or a high spring constant copper alloy such that it affords a restorative spring force to the shape. Furthermore, the addition of a copper backplane will also increase the cooling effectiveness of the strips with good airflow such that fewer higher power LED dies could be considered instead of lower power LED dies.

In another embodiment, it is known that certain types of small lamp shades have a spring loaded clip designed to mechanically spring over the lamp form and provide the mechanical connection between the bulb form and the lamp shade. In such a case, there is afforded either a metal cross-section that interfaces to the clip, or the strips are provided with a sufficiently protective top layer that the force of the metal clip does not damage the LED dies contained within the strips.

In FIG. 1, the 12 LED strips 20 are evenly distributed around the bulb form 30, and the LEDs 22 are evenly spaced on the strips. In other embodiments, the strips 20 are not evenly distributed, and the LEDs are not evenly spaced to customize the light emission. If no special optics are used, each LED 22 emits light in a nearly Lambertian pattern, so the light from nearby LEDs gets mixed. By providing many LEDs around a bulb shape, the resulting light emission pattern is similar to that of an incandescent bulb. Since each LED die produces roughly a hemispherical distribution and the light merges together, the present invention eliminates one major drawback of conventional LED replacement bulbs in that the substantially spherical light distribution of a conventional lamp can be reproduced by the merging of the light emitted by the many small LEDs 22 located around the rounded bulb shape thereby more accurately mimicking the appearance and light distribution of a standard incandescent lamp.

Figure 2:
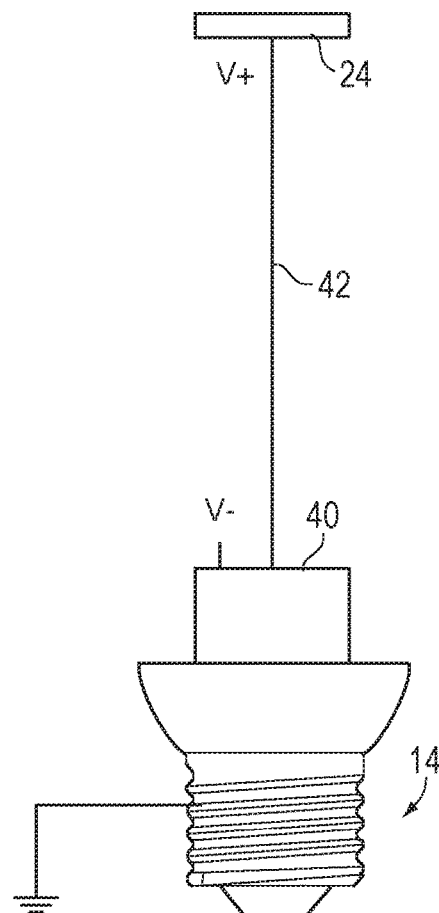
FIG. 2 illustrates the internal AC/DC power supply and the positive and negative terminals for the strips.

FIG. 2 illustrates the inner structure of the lamp 10. A combined AC/DC converter and current driver module 40 receives the mains voltage from the socket and converts the voltage to about 40 volts DC, which is greater than the voltage drops along the strips 20. The positive voltage output terminal of the module 40 is connected via a wire 42 to a termination pad 24 that is mounted to the top of the bulb form 30. The module 40 has a common or ground terminal for connection to the other ends of the strips 20. An alternative embodiment could also have both terminals at either end of the strip.

If the LEDs 22 are matched in terms of overall forward voltage, a single current source may be used to drive all the strips 20. The strips 20 may also have additional matching components or distributions of LEDs contained therein that provide for matched current flows. If the LEDs 22 are not adequately matched, a separate current source and/or switching circuit may be used for each strip 20. The current sources and voltage converter may be part of the same power supply module 40. The heat generated by the module 40 may be removed by a combination of the air openings 34 in the bulb form 30 and the socket.

If the LEDs 22 are also not adequately matched in terms of forward voltage, it may be desirable to include a provision within the strips to custom trim the performance of each strip prior to final assembly of the lamp such that they could be readily combined on a single current source. Means to achieve this include laser trimming of passive components, fuse arrays and other such in-line manufacturing processes that are known in the art to balance arrays of components.

Figure 3:
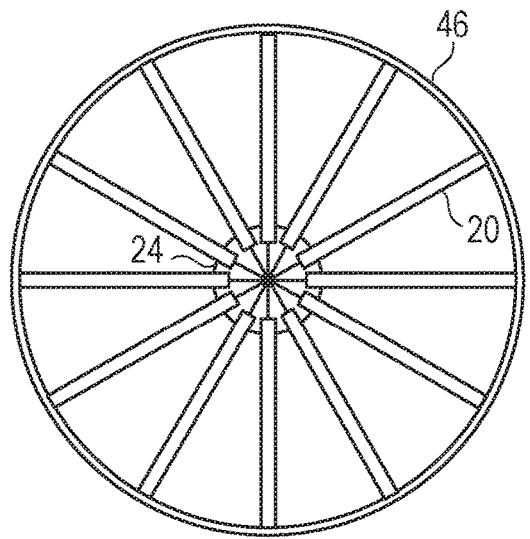
FIG. 3 is a top down view of FIG. 1 illustrating the connections of all the strips to the positive DC terminal.

FIG. 3 is a top down view of FIG. 1, illustrating the termination pad 24 providing the drive voltage to each of the strips 20. The pad 24 may be a relatively large metal pad, or the pad 24 may be provided on a substrate with metal traces connected to associated terminals or the LED strips 20. The wire 42 (FIG. 2) may connect to the pad 24 by a via through the substrate. The pad 24 may be covered with an insulator for safety. Pad 24 may also be designed to optionally provide an electrically insulated solid point at the top of the lamp by which to grasp the lamp and provide the torque necessary to rotate the lamp into the socket such that the correct contact is made at the base.

FIG. 3 also illustrates an optional protective layer 46 of silicone, or other transparent layer, that protects the strips 20 and helps prevent the strips 20 from delaminating during handling by the user. This layer 46 may exist over all parts of the lamp form or only over specific parts of the outer form to protect the strips 20 from mechanical damage or to protect the user from possibly contacting the low voltage DC top terminal pad 24. The layer 46 may also provide optics, such as being a diffuser, or even contain one or more types of light converting materials (e.g., phosphors) to provide conversion between blue or ultraviolet emission from the dies to a broader white light output.

Figure 4:
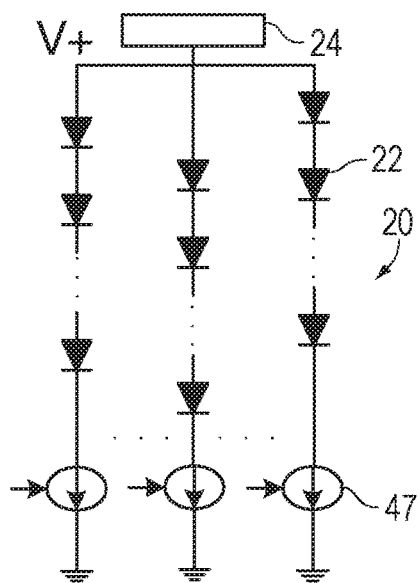
FIG. 4 is a schematic diagram showing the plurality of LED strips connected in parallel.

FIG. 4 is a schematic diagram illustrating the pad 24 providing a drive voltage V+ to the strips 20, connected in parallel, and current sources 47 connecting the other ends of the strips 20 to the common terminal of the driver. The current sources 47 may all be formed on one or more integrated circuits or formed using a combination of discrete components and integrated circuits. The location of the current sources 47 may be embedded within the strips or be located with other power converting electronics. Small power supplies for driving any number of LEDs are commercially available or easily designed. The current through each string may be 20 mA in one embodiment, but depends on the types of LEDs used and other factors. The ground terminals shown at the bottom may be referenced to ground or some other neutral reference level of the electrical supply that enables current to flow through the string.

Figure 5:
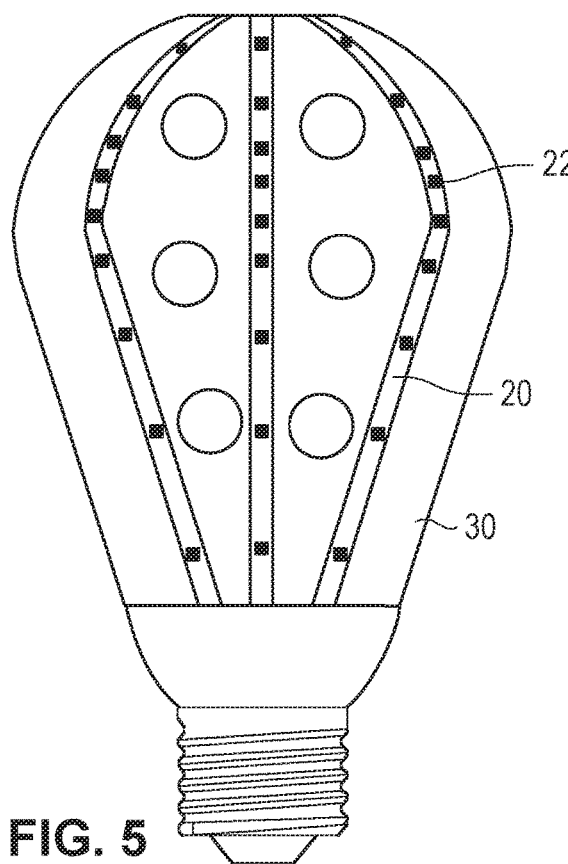
FIG. 5 illustrates how the LEDs can have different densities to provide more uniform light output over the surface of the bulb form or to better mimic the light emission pattern of conventional light sources.

Since the density of LEDs 22 in FIG. 1 is less around the wider part of the bulb form 30 due to the larger area, the light output per area will be less at the wider part. This may be objectionable in certain applications. The embodiment of FIG. 5 provides a more uniform light output along the length of the bulb form 30 by increasing the density of LEDs 22 near the wider part of the bulb form 30. Thus, one of the preferred embodiments of the lamp may closely emulate the photometric of a standard incandescent A-lamp by virtue of a substantially uniform density of LEDs per unit area of the bulb form. FIG. 5 also shows that perforations in the outer envelope may be used to induce air flow through the bulb for additional cooling purposes.

In another embodiment, the LEDs 22 may be affixed inside the transparent bulb form for protection of the LEDs 22.

Figure 6:
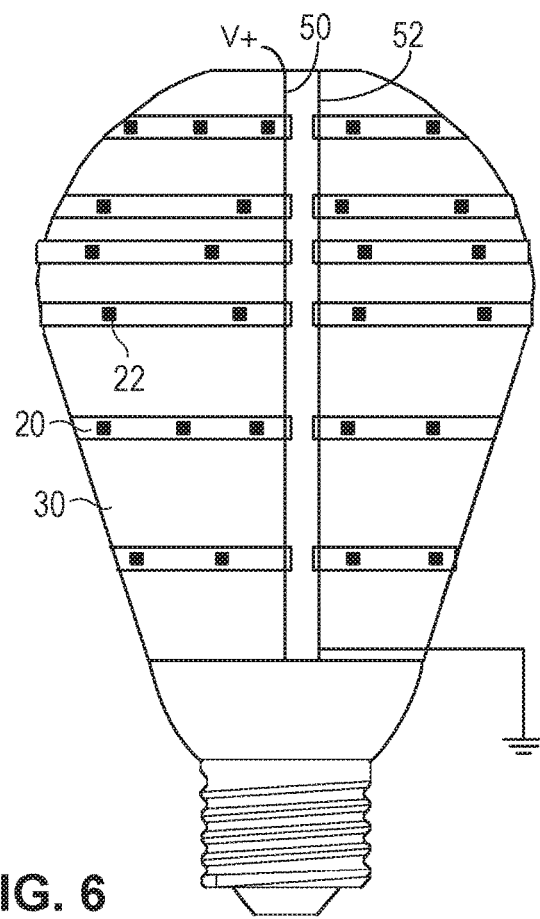
FIG. 6 illustrates the LED strips being latitudinally arranged parallel to one another, with a reduced pitch near the middle of the bulb to achieve a more uniform density of LEDs.

The strips 20 may be arranged in other ways on the bulb form 30. FIG. 6 illustrates the strips 20 being latitudinally arranged around the bulb form 30. The strips 20 are therefore different lengths, yet still have the same number of LEDs 22 in them. The V+ and ground rails 50 and 52 are arranged vertically to connect to the ends of the strips 20. The pitches of the strips 20 near the wider part of the bulb form 30 may be reduced to provide an increased density of LEDs 20 near the central region of the bulb form 30, thereby more closely emulating a traditional lamp luminance pattern. A vertical reveal may also be provided for that will enable air to flow through the body of the bulb thereby providing additional cooling.

Figure 7:
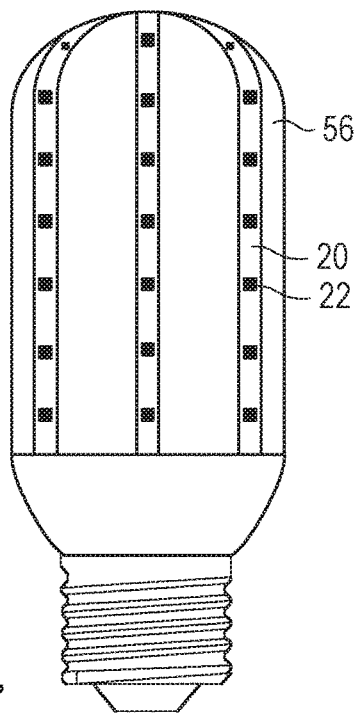
FIG. 7 illustrates a cylindrical bulb that has more uniform light output using identical LED strips.

FIG. 7 illustrates a generally cylindrical bulb form 56 that has a uniform circumference for most of its length. In the industry, these are often called "T" type lamps for their roughly tubular shape. This enables the strips 20 to be substantially identical and equally spaced while providing a uniform light output along the entire length of the lamp. Alternatively, the density of LEDs 20 could also be increased in the central region to more closely emulate a standard filament type lamp.

In another embodiment, the strips 20 may be arranged in a spiral pattern that may even emulate the near field photometric of a conventional compact fluorescent lamp.

In another embodiment, there is no bulb form, and the strips 20 are held in place by a stiff rod that runs through the center of the lamp and connects to the ends of the strips 20. The shape (radius of curvature) of the strips 20 will be determined by the length of the rod. Such an embodiment has the greatest cooling, but the strips 20 are vulnerable to breakage by handling by the user. A handle or other grip-able device may be added at the top of the rod for providing the torque arm for screwing the lamp into a socket.

In one embodiment, to greatly reduce the cost of the strips 20, the LEDs 22 encapsulated in each strip 20 are bare unpackaged dies, and conductive traces in the strips 20 connect the LEDs 22 in series. This reduces the cost per LED 22 by 90% or more, since packaging of LED chips to mount them in a sealed surface mount package is by far the largest contributor to a packaged LED's cost, as shown by the most recent US Department of Energy SSL Manufacturing Roadmap for 2010.

Figure 8:
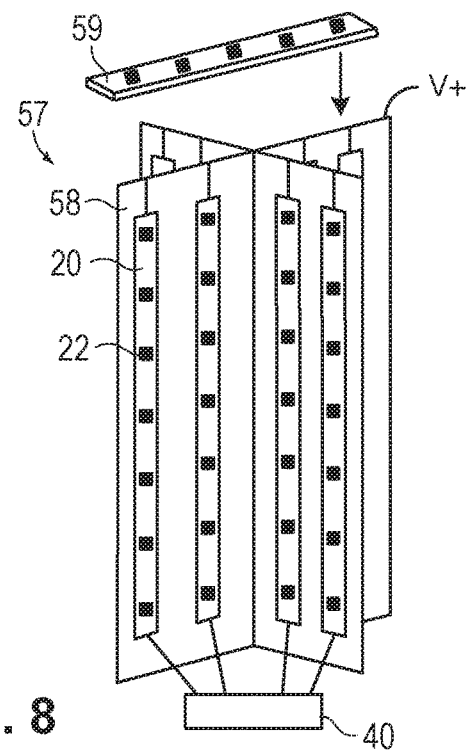
FIG. 8 is a perspective view of a solid state lamp having flat sides.

FIG. 8 illustrates a solid state lamp 57 that is relatively simple to manufacture since the support surfaces 58 for the LED strips 20 are flat. The support surfaces 58 may even be collapsible for packaging. The support surfaces 58 may be transparent or reflective. If transparent, the strips 20 can be bidirectional, discussed later. By providing LED strips 20 on the eight sides of the support surfaces 58, 360 degrees of light emission is obtained to emulate a bulb emission. The strips 20 are shown connected to a positive voltage V+ at one end and current sources in the driver module 40 at their other end. There may be more or fewer support surfaces 58, such as three support surfaces arranged 120 degrees apart while still providing 360 degrees of light emission. The distribution of LEDs within the strips may be uniform or at any localized density as would be desired for the correct near field photometric response. An LED strip 59 may be positioned on top of the lamp 57 to direct light upward for a more spherical light emission. A similar strip 59 can be affixed to the outer edges of the support surfaces 58 to emit light generally perpendicular to the LEDs on the faces of the support surfaces. A round (e.g., cylindrical) diffuser may be placed over the lamp 57 to provide more uniform near field emission and allow the user to handle the lamp without damage to the LED strips 20 when screwing the lamp 57 into an Edison socket. The screw-in base is not shown in FIG. 8. The diffuser may contain air holes to allow heated air to escape.

There may be any number of strips 20 supported by a single surface, and the strips, being transparent, may overlap each other to increase the light output per unit area.

In another embodiment, the shapes of the thin support surfaces 58 may be arced, such as forming a cloverleaf outline as viewed from the top down, where the LEDs are arranged on the rounded outer surface of each support surface to emit light around the arc. This arrangement would provide a more uniform distribution of light, similar to that of the cylindrical lamp of FIG. 7. Having the LEDs arranged on thin arced sheets improves cooling since the backs of the sheets are exposed to ambient air. Any number of LEDs may be distributed over the arced support surface and in any relative density from uniform to highly localized.

Generally, the length of the light-emitting portion of the lamp will be on the order of 2-4 inches to take up an area the same as or less than the area taken up by an equivalent lumen-output incandescent lamp.

FIG. 9A is a perspective view of a portion of an LED strip 60 that may be used as the strips 20 in all lamp embodiments. The strip 60 has a bottom reflective layer 62, a bottom substrate 64, and a top substrate 66. The substrates 64 and 66 may be transparent flex circuits, which are commercially available. The substrates 64 and 66 include metal traces 68 that connect the bare LEDs 22 in series. In one embodiment, the LEDs 22 are vertical LEDs, with a wire bond pad on a top surface and a reflective electrode covering the entire bottom surface. By using the strip structures described below, no wire bonding is needed. The strips 20 may only be 1-2 mm thick and less than 5 mm wide so as to be very flexible and easily affixed over a rounded bulb form. The strip 60 may be expanded in length and width directions to include any number of strings of LEDs and strings of any number of LEDs.

FIG. 9B is a perspective view of an alternative form of an LED strip 69 that may also be used as the strips 20 in embodiments where electrical contacts are desired to be made at only one end of the strip. Trace 68 interconnects the LEDs and can be configured to provide a return path to the same end of the strip as the input trace.

FIG. 10A is a cross-sectional view of four LEDs 22 in the strip 60 sandwiched between substrates 64 and 66. Metal traces 68 on the top substrate 66 and metal traces 70 on the bottom substrate 64 overlap and electrically connect during a lamination process to seal the LEDs 22 between the substrates 64 and 66 to create a series connection. A conductive adhesive may be used to electrically connect the anode and cathode electrodes of the LEDs 22 to the traces and to electrically connect the overlapping traces together.

FIG. 10B is a magnified top down view of two LED areas in the strip 60 of FIG. 10A. The traces 68 and 70 overlap when the substrates 64 and 66 are laminated to form a series connection.

In one embodiment, there may be 12 LEDs in series in a single strip to drop about 40 volts. Ten to fifty or more strips can be connected in parallel (e.g., to the same power supply terminals or to separate current sources) to generate any amount of light.

The LEDs 22 in FIG. 10A may emit a blue light, which is converted to white light by a YAG phosphor or red and green phosphors, or other light converting materials known in the art, overlying the LEDs 22 or positioned remotely from the LEDs 22. Surrounding a blue LED with a white light phosphor is well known, where blue light leaking through the phosphor layer combines with the yellow light or red and green light produced by the phosphor to create white light. It is also well known to provide a remote phosphor tile over the LED. For example, the space around the LEDs 22 in FIG. 10A is filled with a phosphor contained in a silicone binder, and a phosphor tile is affixed on the top substrate 66 overlying each LED 22 so that each LED area emits white light 70 having any color temperature or color coordinate.

FIG. 11A illustrates an end of the LED strip 60 where a terminal pad 74 is formed on a portion of the bottom substrate 64 that extends past the top substrate 66. Since the terminal pad 74 is electrically connected to the anode (bottom contact) of the end LED 22 in the strip 60, the terminal pad 74 will be connected to a terminal of the current source 46 (FIG. 4), which may be a terminal on the power supply module. FIG. 11B is a top down view of the end of the strip 60. A similar termination is at the other end of the strip 60 where the strip terminal pad is connected to a cathode of the end LED 22 and connected to the pad 24 (FIG. 2) that provides the positive voltage to the strips 60.

Figure 12:
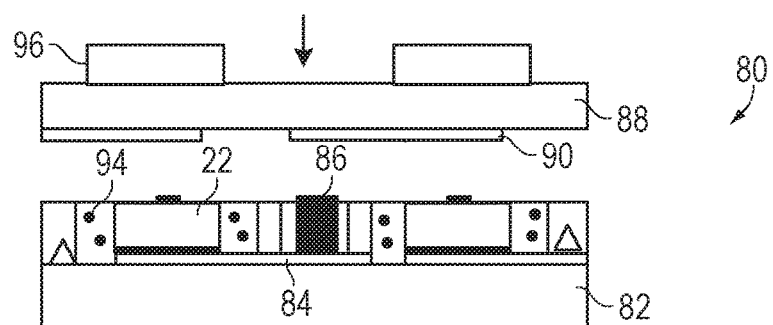
FIG. 12 is a cross-sectional view of a portion of another embodiment LED strip or sheet, where the LEDs are connected in series via a conductive link.

FIG. 12 illustrates a portion of a different type of strip 80, where the bottom substrate 82 includes traces 84 which connect the bottom electrodes of the LEDs 22 to a metal slug 86, or other metal via, and the top substrate 88 includes traces 90 that connect the LEDs 22 in series when the substrates 82 and 88 are laminated together. Phosphor 94 surrounds the LEDs 22, and a phosphor tile 96 overlies the blue LEDs 22 to create white light.

In another embodiment, the slug 86 can instead be a conductive element with fusible properties or other useful electrical properties, such as any one of, or combinations of, surge protection, switchability, or even digital memory storage, current control, or filtering. Therefore, the connections between LEDs may be managed or even selectively opened or closed after initial fabrication by laser, overcurrents, etc.

LEDs other than blue LEDs may be used, such as UV LEDs. Suitable phosphors and other light conversion materials used separately or in mixtures are used to create white light or various desirable color points as may be necessitated by the system. Instead of LEDs, any other light emitting dies can be used, including laser diodes. OLEDs and other emerging light generating devices may also be used. Instead of phosphors, quantum dots or other wavelength conversion materials may be used.

Further descriptions of suitable flexible LED strips and sheets are found in U.S. patent application Ser. No. 12/917,319, filed 1 Nov. 2010, entitled Bidirectional Light Sheet for General Illumination, assigned to the present assignee and incorporated herein by reference.

Figure 13:
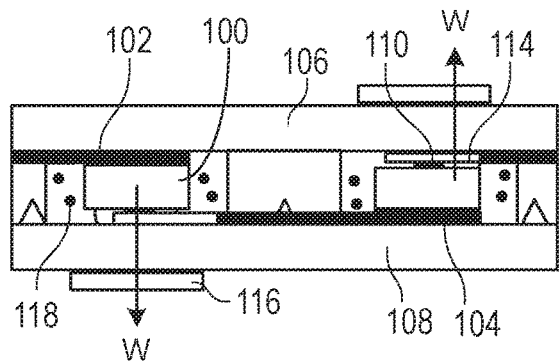
FIG. 13 is a cross-sectional view of a portion of an LED strip or sheet where light is bidirectionally emitted.
Figure 14:
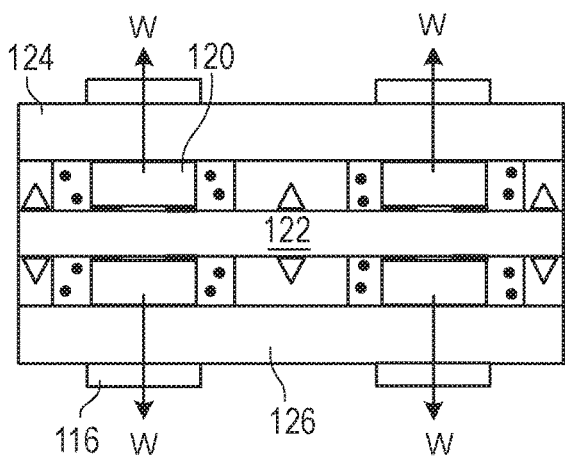
FIG. 14 is a cross-sectional view of a portion of another embodiment of an LED strip or sheet where light is bidirectionally emitted.
Figure 15:
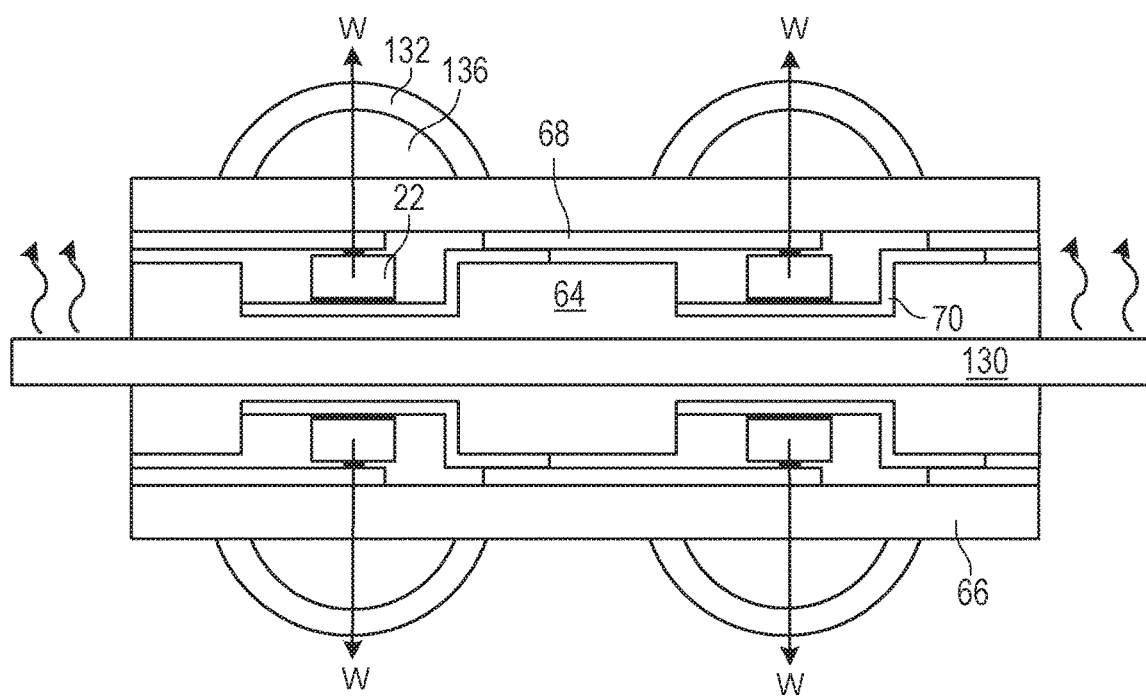
FIG. 15 is a cross-sectional view of a portion of yet another embodiment of an LED strip or sheet where light is bidirectionally emitted.

In all embodiments, depending on the desired light emission, the LED strips or LED sheets may be bidirectional, meaning that light is emitted from both surfaces of the strip or sheet. FIGS. 13-15 illustrate some suitable bidirectional light strip/sheet structures, where more detail may be found in the above-mentioned U.S. patent application Ser. No. 12/917,319.

FIG. 13 illustrates LED dies 100 that are oppositely mounted in a light strip or sheet to create a bidirectional emission pattern. There is no reflector layer covering the bottom of the strip/sheet. Any number of LED dies 100 are connected in series by alternating the orientation of the LED dies along the light strip/sheet to connect the anode of one LED die to the cathode of an adjacent LED die using metal conductors 102 and 104 formed on the top substrate 106 and bottom substrate 108. The substrate electrodes contacting the LED electrodes 110, formed on the light-emitting surface of the LED dies, may be transparent electrodes 114 such as ITO (indium-doped tin oxide) or ATO (antimony-doped tin oxide) layers. Alternatively, very thin conductive traces that are not transparent may be used that may only occlude a small percentage of the light emission from the LED die.

A phosphor layer 116 may be deposited to generate white light from the blue LED emission. The sides of the LED dies 100 may be encapsulated by phosphor 118 infused in a silicone binder.

FIG. 14 illustrates two light strips/sheets back-to-back. The LED dies 120 are shown as flip-chips, and the conductor layers for interconnecting the LED dies on each side in series are deposited on opposite sides of the middle substrate 122. The light strip/sheet structure is sandwiched between transparent substrates 124 and 126. The middle substrate 122 may include a reflective layer that reflects all impinging light back through the two opposite surfaces of the bidirectional light strip/sheet.

FIG. 15 is another example of two light strips/sheets, similar to the light sheet described with respect to FIG. 10A, affixed back-to-back with a middle reflective layer 130. The conductors 68 and 70 and substrates 64 and 66 are described with respect to FIGS. 10A and 10B. The light strips/sheets may be affixed to the middle reflective layer 130 using a thin layer of thermally conductive silicone or other thermally conductive adhesive. Phosphor 132 may be used to convert the blue LED light to white light. The substrates 66 may be formed with lenses 136 to create the desired light emission.

The middle reflective layer 130 may be a good conductor of thermal energy, which can assist the conductors 68 and 70 in dissipating the heat from the LED dies 22. There may be enough thermal mass within the layer 130 that it provides all of the heat sink required to operate the LED dies 22 safely or it may be extended laterally, beyond the edges of the substrates 64 and 66, to regions where the heat may be dissipated more freely to the air within the lighting fixture or lamp. Reflective layer 130 may also interface to matching thermal details within the luminaire to extend the thermal conductivity to other surfaces.

The light output surfaces of the various substrates may be molded to have lenses, such as Fresnel lenses, that customize the light emission pattern. Different lenses may be formed over different LED dies to precisely control the light emission so as to create any spread of light with selectable peak intensity angle(s).

Any of the lamps described herein may use any of the light strips/sheet described herein to achieve a desired light emission pattern or to achieve the desired lumens output.

Figure 16:
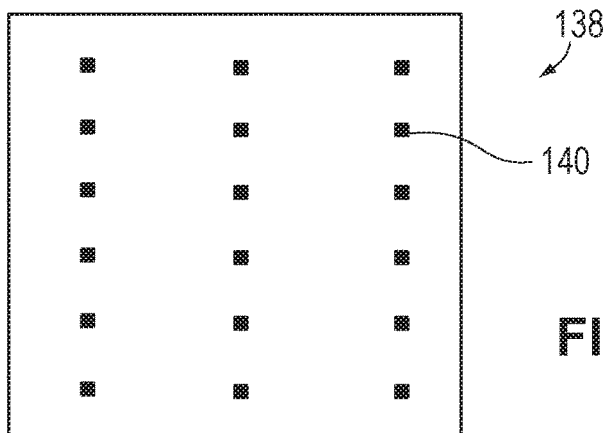
FIG. 16 is a front view of a light sheet containing many encapsulated bare LEDs. The light sheet may be bidirectional or emit from only one side.

FIG. 16 is a front view of a light sheet 138 containing many encapsulated bare LED dies 140. For example, there may be 100-200 LEDs in the light sheet for emulating a 60 watt incandescent bulb. The light sheet 138 may be bidirectional or emit from only one side. In one embodiment, the LED dies 140 in a single column are connected in series, and the columns are connected to individual current sources in the power supply module within the lamp. The LED light is phosphor-converted to produce white light of a certain color temperature.

Figure 17:
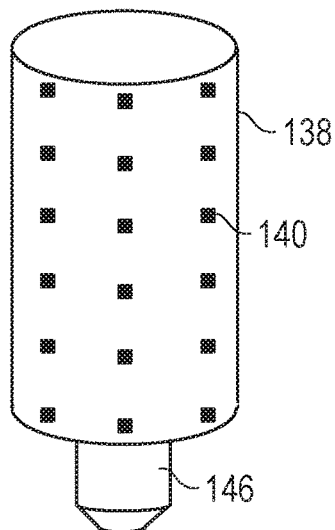
FIG. 17 illustrates the light sheet of FIG. 16 bent in a cylinder as a replacement for an incandescent bulb.

FIG. 17 illustrates the light sheet 138 of FIG. 16 bent in a cylinder as a replacement for an incandescent bulb. If the general size of the bulb is to be maintained, the diameter of the cylinder may be on the order of 2.5 inches and the height of the cylinder may be on the order of 2-3 inches. The standard Edison screw-in connector 146 is shown.

Figure 18:
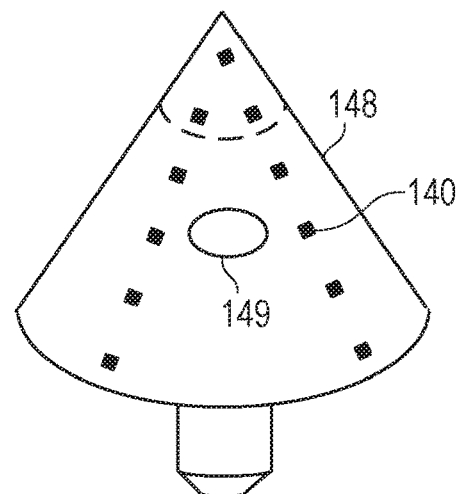
FIG. 18 illustrates the light sheet of FIG. 16 bent in a cone or truncated cone as a replacement for an incandescent bulb.

FIG. 18 illustrates a light sheet 148, similar to FIG. 16 but formed circular, where the light sheet 148 is bent to form a cone or truncated cone as a replacement for an incandescent bulb (the top of the truncated cone is indicated by a dashed line). The light emission may be only up, only down, or bidirectional. In another embodiment, openings 149 are formed in the sheet 148 for air to flow through.

Figure 19:
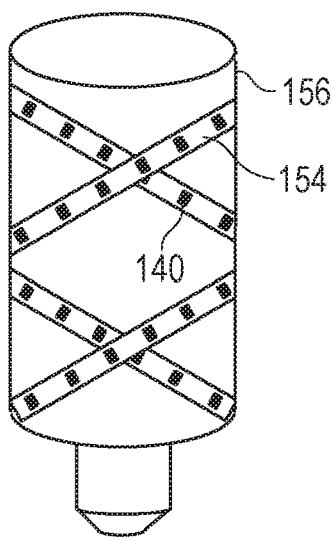
FIG. 19 illustrates a plurality of LED strips around a form, where the color temperatures of the individual strips are combined to create an overall target color temperature.

FIG. 19 illustrates a plurality of LED strips 154 around a transparent cylindrical form 156. The strips 154 are shown overlapping and spiraling for better mixing of light from the individual strips 154. The ends of the strips 154 are connected to the positive voltage terminal and current source terminals of the driver module in the base of the lamp.

An alternative embodiment could have the strips woven to create a lamp form and provide structural integrity. Since the strips are transparent, they will still allow light to pass through and not create losses due to shadowing.

Blue LED dies have slight variations in peak wavelength due to process variations. However, when the phosphor-converted light from a variety of LED dies are combined, their observed correlated color temperature along, or proximate to, the well-known black body curve is generally the average of all the individual color temperatures. Therefore, for all embodiments, the color temperature, or color coordinates, or spectral power distribution (SPD) of each LED strip may be measured by conventional optical test equipment when energizing the strip, and the strips are binned (e.g., classified in a memory or physically separated out) based on color temperature, or color coordinates, or SPD. In some cases, an SPD has an equivalent correlated color temperature. The bins may be separated by, for example, 10K or 100K temperature resolutions or any other resolution, depending on the desired color temperature precision. When the strips are to be combined into a single lamp, the strips from different bins may be combined to achieve the target color temperature, or color coordinates, or SPD, assuming the light is generally on the Planckian locus. A simple algorithm for mixing color temperatures or SPDs to achieve the target color temperature or SPD may be used by a computer simulation program to determine the number of strips from the various bins to combine to generate the target color temperature or SPD. The algorithm may also determine the placement of the strips relative to each other on the form in order to achieve the target color temperature or SPD 360 degrees around the lamp. In this way, the yield is very high since all strips would be used irrespective of its color temperature or SPD. Such mixing of color temperatures, color coordinates, or SPDs may also be performed on an LED by LED basis to achieve a target overall color temperature, or color coordinate, or SPD per strip. In this way, lamps will be produced that output approximately the same color temperature. This is in contrast to a well documented trend in the industry towards utilizing fewer and fewer large LED dies to achieve the target light flux. In this latter case the requirement for careful binning becomes increasingly important with an attendant yield issue that begins to increase the cost of manufacturing.

In one embodiment, the blue LEDs are tested and binned, such as in peak wavelength resolutions of 2 nm, and the specific combinations of LEDs in a strip are applied to an algorithm to determine the correlated color temperature or SPD of the strip without the need for separately testing the strip. Alternatively, the LEDs do not need to be tested separately, and the only color testing and binning are performed at the strip level. This greatly reduces testing and binning time.

Since a typical LED manufacturer bins the blue LEDs with a peak wavelength resolution of 2 nm and only uses LEDs from the same bin in a single device for color uniformity, any technique to allow the use of LEDs from different bins in a single device, even within a peak wavelength range of 4 nm, will greatly increase the effective yield of the LEDs. Therefore, using blue LEDs having peak wavelengths within a 4 nm range or greater in the same strip is envisioned.

Generally, the LEDs that make up the strips have a certain range of SPDs that occurs as a result of process variations and other limitations that occur during the fabrication process. It is a goal to use any combination of such LEDs to maximize the LED yield and reduce the cost of the resulting lamp.

One scenario may be that the LEDs in a single strip are from widely diverse bins, separated by, for example, 10 nm. However, the wide SPD of light from the single strip may desirably increase the color rendering index (CRI) of the strip.

If the same combination of LEDs from different bins is used in each strip to create the desired target color temperature or SPD for each strip, testing each strip is unnecessary.

In another embodiment, each pair of adjacent strips is selected so that the aggregate SPD or color temperature of the pair approximately matches the SPD or color temperature of the lamp. This improves color uniformity around the lamp and allows a wide range of LED bins to be used in the strips. Any number of strips may be combined to generate the target SPD or color temperature.

The same principle applies as well to color converted strips that may be selected based upon their final binned performance and when combined in the aggregate within a single lamp provides the target SPD and flux performance. These are then manufactured with a range of blue LED dominant wavelengths, color converted by any one of a number of means, and then binned based on their final flux, SPD and/or other characteristic that permits a uniformity within tolerance for the aggregate light output of the lamp. The light from strips of slightly different color temperatures (from difference bins) can also be combined to produce an aggregate target color temperature and via variable driving means, can be controlled by internal or external means to create a range of color temperature or even track a typical incandescent color temperature and flux dimming profile. Combining different strips with compensatory color temperatures is an effective means to reduce the overall color temperature variation between lamps and to enable additional functionality or emulation to the finished lamp.

In an alternative embodiment, the strips 154 could be placed parallel to one another, similar to FIG. 6 and evenly or unevenly spaced.

Further, since the strip substrates may both be transparent, strips may completely overlap each other to combine the colors and increase the light output per area.

The flexibility of the LED strips allows the strips to be temporarily or even permanently bent or compressed for storage, shipping, or use.

Figure 20:
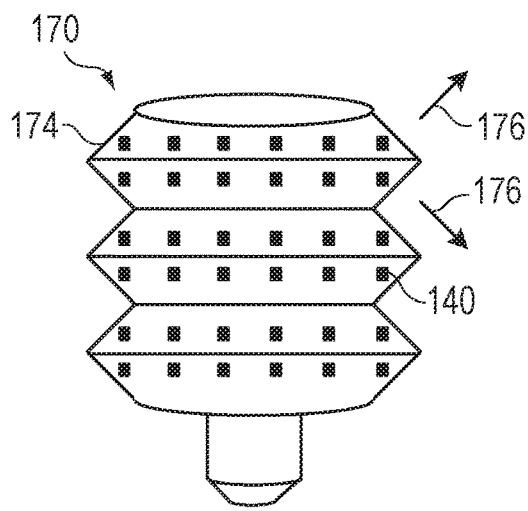
FIG. 20 illustrates a solid state lamp formed by a corrugated LED sheet or by a plurality of LED strips affixed to a form, where the lamp may be compressible.

FIG. 20 illustrates a solid state lamp 170 formed by a corrugated LED sheet or by a plurality of LED strips affixed to a compressible form 174, so that the lamp may be compressed for storage. The lamp 170 resembles a small Chinese lantern. An additional benefit of the corrugated shape is that some LEDs are aimed upward and some LEDs are aimed downward, providing a substantially spherical light emission 176 similar to a standard bulb. The user may expand the lamp 170 to a variety of lengths, where the light emission pattern varies with length. A shorter length provides more up-down light, while a longer length provides more side light thus enabling different photometric intensity profiles for use in different lighting fixture means.

FIG. 21A illustrates a solid state lamp 180 having a base 182 containing at least a portion of a driver, where the LED strips 184 retain their shape when bent. The strips 184 may contain a thin copper or aluminum strip for heat extraction that additionally retains its shape when bent. The lamp 180 may be packaged with the strips 184 unbent for minimum space, and the user may bend the strips 184 in any shape to achieve a desired emission pattern. While the design may be considered useful for decorative means it may also provide for minimized packaging volume and enable a wide range of different fixture photometric profiles that can add efficiency, aesthetic advantages and variety for new light fixture designs. For example, the strips 184 may be bent in a bulb shape to emulate the emission pattern of a standard bulb. A virtually unlimited array of light emission patterns, including some highly decorative versions, may be enabled by this embodiment. In another embodiment, it is also possible to have different color coordinates or color temperatures which may be differentially aimed to create different patterns within a lamp shade or luminaire. It is even possible to combine strips with lambertian emission patterns with strips that have prescribed directional light emission within the same bulb to enable multiple functions from the same lamp. For example, it is possible to have some strips designed for side illumination and indirect lighting within sconce while other strips are "aimed" with optical control to provide strong directional up or down light for increased task illumination. The LED strip 69 of FIG. 9B may be used in the embodiment of FIG. 21A.

A clear outer shell may be used to protect the strips in the embodiment of FIG. 21 and allow the lamp to be handled by the user.

FIG. 21B is similar to FIG. 21A but the strips 185 are designed with variable widths and distributions of LED dies. In this embodiment, the LED dies are arranged in patches at the tips of the strips 185 that widen into larger areas at their tips. One advantage of this is to increase the light flux at the "light center" of the lamp, which more closely emulates a standard incandescent lamp. This embodiment also allows for the LED dies to be turned through larger angles to enable aiming of the tips of the strips 185 to enable some of the functionality described above.

FIG. 22 is similar to FIG. 21A, where the LED strips 184 are straight or aimable via rotation and angular displacement. The distribution of LED chips may also be adapted to be higher or lower in regions.

In one embodiment, a reflector may partially surround the strips 184 to confine the beam, similar to an MR-16 type bulb. In another embodiment, additional strips may be affixed to the outer surface of the reflector to emit light in a downward direction relative to FIG. 21. In another embodiment, a diffuser may also completely, or partially surround the strips 184 to soften the light distribution. In both cases, the reflector or diffuser described above may be removable and replaceable as an option that is sold with the base lamp 21 or 22 and supplied as directed or desired by the user or fixture design.

In FIGS. 21A, 21B, and 22, there may be two or more strips. In one embodiment, there are up to 12 strips, each strip containing 12 LEDs in series for providing sufficient lumens to replace a 60 watt incandescent bulb. The strips may be connected in parallel, and each strip may be associated with its own current source in the power converter.

The strips may be corrugated instead of flat to create a broader beam. The strips may have lenses formed in them.

In one embodiment, the strips are about 1-6 inches long depending on the allowable space and desired light output. The strips may bendable between an angle perpendicular to the central axis of the lamp and parallel to the central axis to maximize control of the light emission pattern. The strips may be arranged to emulate most types of standard bulbs. Any electrical connector can be used.

FIG. 23A illustrates a solid state lamp 188 formed of a single LED sheet or a plurality of LED strips, where the sheet or strips are configured to create a polygonal cross-section. The sheet or strips may be affixed to a polygon form with flat sides. The polygon may be vented or made from thermally conducting material such that heat is transferred to other regions of the lamp for cooling. For example, ventilation holes 189 in the base can result in buoyancy driven air flow to run parallel to the vertical axis within the lamp body and be ventilated in either direction depending upon the orientation of the lamp.

FIG. 23B is a cross-sectional view of FIG. 23A along line A-A in FIG. 23A showing that the lamp is a six-sided polygon to provide good 360 degree light emission. Each side may be associated with its own current source to ensure substantially equal light output per side.

Figure 24:
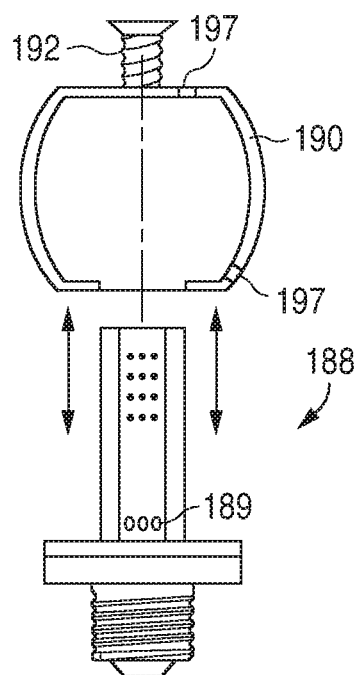
FIG. 24 illustrates a solid state lamp, similar to FIG. 23A, with a diffuser being positioned over it.

FIG. 24 illustrates a solid state lamp 188, similar to FIG. 23A, with a substantially spherical diffuser 190 being positioned over it so that the light emission better emulates a bulb. The diffuser 190 also provides protection for the LEDs and allows the user to apply torque to the screw-in base without touching the LED strips. The diffuser 190 may be held in place by a screw 192, a clamp, locking tabs, an adhesive, or any other means.

In another embodiment of FIG. 24, the diffuser 190 is designed to be adjustable up and down such that it can be positioned vertically at different heights to effect a change in spatial distribution. The diffuser 190 may also incorporate regions of diffusion with regions of transparency with regions of specular reflectivity as may offer a unique light distribution for particular lighting fixture design. One such example in the incandescent world is to create regions near the top hemisphere of the bulb glass envelope with highly specular reflectivity to shield direct view of the filament. The equivalent property could be exploited in this design with the added advantage that it could be designed such that it could be adjusted vertically to control the cut-off angle suiting the user's requirements. Diffuser 190 may also have perforations 197 or reveals to permit air flow to pass from the bottom to the top for additional cooling of the LED dies. The screw fastener 192 shown is one example of a means to fix the diffuser to the central lamp structure. Other methods include snap fitting, threaded fitting and interference fitting that will provide for mechanical joining of the removable and replaceable reflector or diffuser assembly.

In another embodiment, diffuser 190 may contain a remote phosphor or light conversion material to help create light of a desired spectrum from the underlying LED dies.

In one embodiment, there is no phosphor on the LED strips, so the strips emit blue light. The diffuser 190 is coated with phosphor for converting the blue light to white light.

Figure 25:
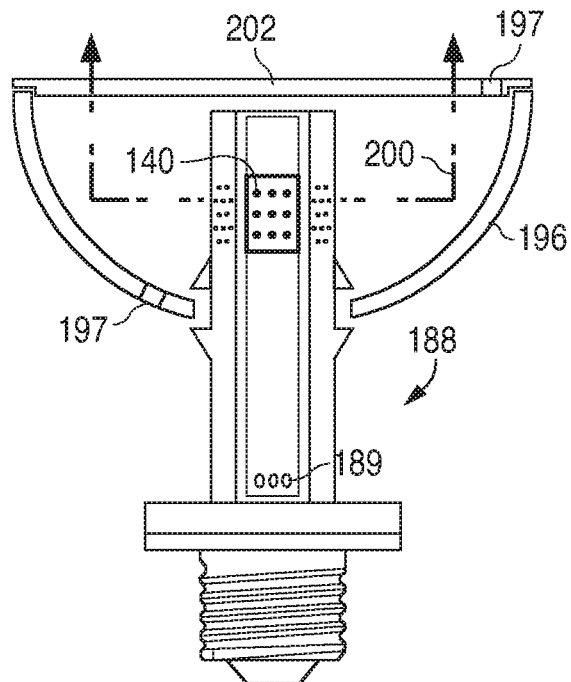
FIG. 25 illustrates a solid state lamp, similar to FIG. 23A, with a reflector surrounding the LEDs.

FIG. 25 illustrates a solid state lamp 188, similar to FIG. 23A, with a hemispherical or parabolic reflector 196 surrounding the LEDs. Optionally, perforations 197 in one or both of the reflector 196 or the diffuser/optic 202 will aid in cooling of the LED die. A variety of types of diffusers or reflectors may fit over the same lamp 188 to achieve different emission patterns. The light emission 200 from the LEDs 140 is shown reflecting off the reflector's 196 inner surface and being emitted in a forward direction to achieve a spotlight effect. A transparent or diffusing window 202 may be provided over the lamp. The reflector 196 may instead be a diffuser and can be designed to be removably attached to the lamp pedestal such that the end user may change the desired distribution from a hemispherical light distribution, as with a globe diffuser, to a reflector lamp with a narrow beam distribution by changing the reflector 196. Preferably, there will be an allowance for mechanically connecting the reflector/diffuser component and any external lenses, diffusers or homogenizers as are known in the art. The wide variety of optical conversion materials and structures that can be attached to the central lamp form offers end users great utility in that they can readily modify the lamp spatial emission characteristics without removing the underlying lamp from the socket. Since the underlying lamp form 188 can remain in a luminaire socket for decades of useful life in residential and commercial applications it is advantageous and environmentally prudent to be able to readily change the optical and emission characteristics of the lamps over time.

Additionally, the LED strips or LED sheet in FIG. 25 may be replaceable while retaining the remainder of the lamp to achieve different characteristics, such as increasing or decreasing the lumen output or changing the color. The LED strip or sheet may have a plug-in connector and be a snap-fit.

The bottom portion of the lamp 188 may be formed of a good thermal conductor and is exposed to ambient air with air channels for aiding in cooling. In this way, the lamp is cooled in any orientation.

Figure 26A:
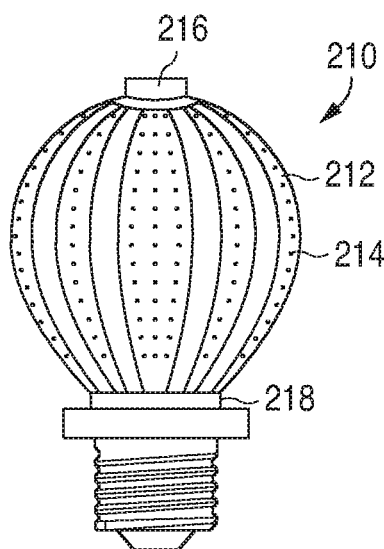
FIG. 26A illustrates a solid state lamp having a plurality of bendable LED strips supported at their ends to form a lamp having a customizable shape.

FIG. 26A illustrates a solid state lamp 210 having a plurality of LED strips 212 supported at their ends to form a lamp having a customizable shape. The strips 212 may have an increased density of LEDs 214 near their middle to provide more uniform spherical light emission. The radius of curvature of the strips 212 may be set with a screw 216 at the top of the lamp 210 connected to the base 218. The screw 216 (or other fastener) may also be adapted to be gripped by a user to provide a torque for screwing the lamp into a socket. A positive voltage is coupled to one end of the strips 212 and current sources are connected to the other ends of the strips 212, as shown in FIG. 4.

In another embodiment, all connections to the power converter can be made exclusively at the bottom of the strips so that the top of the lamp may be electrically neutral for safety.

In another embodiment, FIG. 26A may have the strips 212 rotationally variable such that all of the strips can be fanned to one side or distributed evenly. For example, FIG. 26B may also represent a flat, fanned out array of strips 212 with all electrical connections at one end near the central pivot point. This mode can be useful for uses of the lamp where it may be desirable to have the light emit from only one side of the lamp such as in a wall sconce.

In another embodiment, the strips 212 may be selectively fanned out by the user in the bent configuration shown in FIG. 26A so that the lamp emits light in an asymmetrical pattern.

Figure 26B:
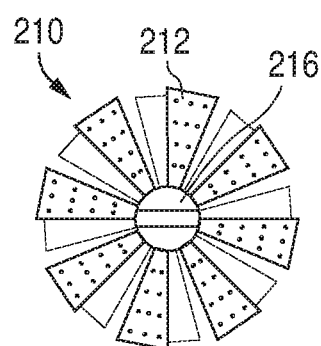
FIG. 26B is a top down view of FIG. 26A.

FIG. 26B is a top down view of FIG. 26A showing the individual strips 212 and the screw 216.

FIG. 27 illustrates a solid state lamp 230 that is compressible for packaging. The LED strips 232 are diamond shaped, or any other convenient foldable shape, to provide an increased density of LEDs near the middle of the strips for more uniform spherical light emission. The strips 232 are formed to have a crease in the middle, or separate strips 232 may be provided on the upper and lower halves of the lamp 230 to avoid a severe bend in the strips. The LED driver may be within the base structure 234.

As with FIG. 20, the height of the lamp 230 may be adjustable to greatly control the light emission pattern. A more compressed lamp will provide more up-down light, while and expanded lamp will provide more side light. The height may be adjustable by turning a central screw or simply compressing or expanding a central friction slip rod or any other means.

The lamps of FIGS. 20 and 27 may have a large surface area for better cooling of the LEDs. The central open area further increases air cooling.

In one embodiment, a sheer insect-blocking netting is provided over the opening.

An Edison-type screw-in connector for an incandescent bulb is usually required to provide a portion of the support for the vacuum chamber for the filament. However, for a solid state lamp, the electrical connector can be any of a variety of shapes as long as it has the ability to connect to the standard Edison socket and provide the necessary safety clearance for shock. In one embodiment, the lamp 230 has a screw-in type electrical connector 236, having a relatively narrow central shaft 237 and two or more metal tabs 238 that engage the threads in the Edison socket 239 (threads and hot electrode shown). The connector's 236 hot electrode 240 is connected to a wire that runs inside the shaft 237 to the driver.

FIG. 28 is a bisected view of the lamp 230 of FIG. 27 in its compressed state, showing the electrical connector 236 in its stored state. The connector 236 is relatively thin and may be foldable for storage.

FIG. 29A illustrates in more detail the connector 236 of FIG. 28. The connector 236 has wide flat sides 246 and portions of threads 248 on its narrower sides that correspond to the matching screw shell of the standard socket 239. The view of FIG. 27 shows the narrow side of the connector 236. The threaded area may be copper affixed to an insulating support material 249 (FIG. 29A). The structure will screw into a standard Edison socket 239. A hot electrode 240, extending through the insulating support material 249, connects to a top terminal 250, which is, in turn, connected to one input of the driver. The driver is optionally housed within the base structure 234, which also provides a finger safe shock shield over the top of the corresponding socket. The copper threads 248 connect to another input of the driver. Tabs 238 extend from the connector 236 in its down position once the connector 236 is positioned by the user. The tabs 238 can be provided on both sides of the connector 236 and, when locked in position, provides four points of contact within the Edison socket 239 and permits the lamp to be screwed into the socket in a normal fashion. Since solid state light sources offer extraordinary life expectancy measured in decades, it is reasonable that lamps will typically be installed and then left for many years without any need for replacement. Thus, the requirement for simple removal and replacement may be relaxed in terms of mechanical convenience and ergonomics and instead be directed to quick installation methods for rapid deployment in the field.

In another embodiment, which may be similar in appearance to FIG. 27, the metal tabs 238 act as resilient metal springs that allow the lamp 230 to just be pushed into the Edison socket 239 without any turning of the lamp. The tabs 238 have an acute angle portion that engages the threads of the socket 239 and resiliently locks in the lamp. There may be 2, 3, or four tabs 238, depending on the desired rigidity of the lamp connection to the socket. The hot electrode 240 may be spring loaded (urged into its expanded state) to ensure firm contact with the hot electrode of the socket as the tabs 238 settle into a trough of the socket thread. Typically, an Edison type screw-in socket has a resilient hot electrode 252 (FIG. 27), so spring loading the hot electrode 240 of the connector 236 may not be needed. A central support shaft may form the central axis of the lamp and can be used to apply the pressure for inserting the connector 236 into the socket 239. In such a push-in embodiment, the copper threads 248 of FIG. 29A would be omitted, and the central shaft may be a more narrow cylinder or rectangular bar.

FIG. 29C is a cross-sectional view of another embodiment of a push-in connector for an Edison-type screw-in socket. In FIG. 29C, conductive captive balls 251 within receptacles around a conductive or insulating vertical shell 252 provide the mechanical locking within the Edison-type socket. The captive balls 251 are urged outward by springs 253 so as to have sufficient restorative force that they can readily be inserted with sufficient pushing force and yet remain tight within the socket for mechanical and electrical integrity. Removal is the reverse and could be either by exerting a strong pull or via the typical unscrewing rotational action of traditional designs. The neutral or ground potential of the socket is conducted by the balls 251, springs 253, and central metal conductor 254 to a power supply input of the LED driver (not shown) in the base of the lamp. The hot potential is conducted from the hot electrode 255 by a wire 257 to the other input of the driver. Many different ways of coupling the potentials to the driver are envisioned.

In another embodiment related to FIG. 29C, the act of pushing vertically down on the top of the lamp will force a spring loaded central plunger (may be similar to the conductor 254) down and free the balls 251 within their receptacles in a horizontal direction, allowing the lamp to be freely inserted. As the plunger is allowed to move to its normal resting position, a central cam may push the balls out and lock them into the socket. Removal will then either be via a standard rotational motion or could be enabled by having a reverse detail on the central shaft that will permit the balls 251 to be retracted when the lamp is pulled from the socket.

FIG. 30 illustrates an electrical connector 256, extending from a base 258, having a handle 262 affixed to it to provide torque for screwing a solid state lamp into a socket or pushing the lamp into the socket. The handle 262 is optional if there is other means to screw or push the lamp into the socket. The base 258 may support the LED strips or a bulb form.

Figure 31:
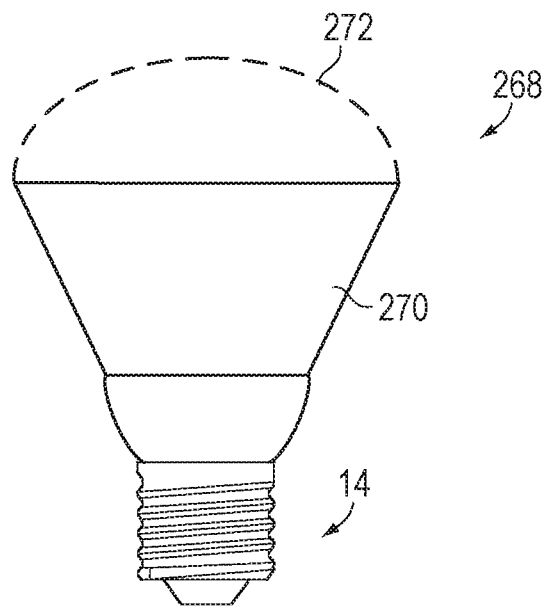
FIG. 31 is a side view of a solid state lamp that has a directed light emission.
Figure 32:
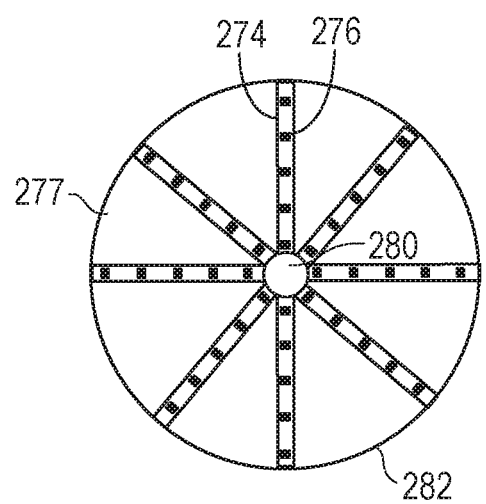
FIG. 32 is a top down view of the lamp of FIG. 31 where the LED strips are arranged radially on a support surface.
Figure 33:
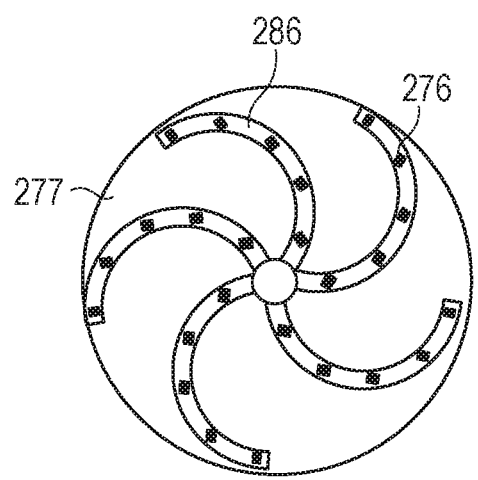
FIG. 33 is a top down view of the lamp of FIG. 31 where each LED strip has a curved shape.

In certain applications, it is desirable for a solid state lamp to provide a more directed light emission rather than a standard bulb emission. FIGS. 31-33 illustrate a solid state lamp that may be used to provide a more directed beam.

FIG. 31 is a side view of a solid state lamp 268 that has a directed light emission. The lamp 268 has a standard screw-in base 14, and a driver is included in the lamp 268. The lamp 268 has a body 270 for supporting a plurality of LED strips, which may be any of those LED strips previously described. A diffuser 272 is optional.

FIG. 32 is a top down view of the lamp of FIG. 31 without the diffuser 272. In the example, there are eight LED strips 274 encapsulating any number of bare LED dies 276. There may be any number of strips and any number of LED dies per strip, such as 12 strips, each containing 12 LED dies connected in series.

A central pad 280 is connected to an end lead of each strip 274 and may supply a positive voltage provided by the driver. The other end of each strip 274 may be connected to a common conductor or to an associated current source, as shown in FIG. 4. In the simplified example of FIG. 32, the perimeter of the circle is a common conductor 282 connected to all the strips 274 so all the strips 274 are connected in parallel.

If the surface 277 supporting the strips 274 is flat, the light emission from the strips 274 will, at most, be hemispherical, and lenses formed on the strips' substrates may be used to narrow or direct the beam to create a spotlight effect. The diffuser 272 may instead include a lens for directing the beam. The lamp 268 may replace directional lamps such as types MR-16 (2 inch diameter), R30 (3¾ inch diameter), PAR 38 (4¾ inch diameter), and others.

The surface 277 supporting the strips 274 may be thermally conductive and reflective, such as aluminum, to draw heat from the LED dies 276, and the body 270 removes the heat from the metal by transferring the heat to the ambient air. Holes may be formed in the body 270 to create an air flow contacting the bottom surface of the metal support. If the LED dies 276 are low current types (e.g., 20 mA), removing heat will not be difficult since the LED dies 276 are spread over a relatively large area.

The surface 277 supporting the strips 274 need not be flat, but may be concave or convex (e.g., conical) to affect the light emission pattern, such as making the light beam wider or narrower, or increasing the proportion of side light, etc. . . .

FIG. 33 is a top down view of the lamp of FIG. 31 where each LED strip 286 has a curved shape to better distribute the LED dies 276 over the metal surface 277. This not only creates a more uniform light beam but spreads the heat from the LED dies 276 over a larger area for increased cooling.

Many other shapes of the LED strips can be used. In another embodiment, a single strip can be formed in a long spiral around the central axis to distribute the LEDs. In another embodiment, the strips may be concentric circles. Instead of LED strips, the LEDs may be distributed in an LED sheet, such as shown in FIG. 16.

As previously discussed with respect to FIG. 19, the strips 274/286 may be pre-tested for color temperature and binned, and strips may be combined from different bins to create a target color temperature. Therefore, all lamps 268 will output white light having the same overall color temperature.

The flexible structure and selectable width of the light strips allows them to be bent to form various types of lamps having particular light emission characteristics.

Figure 34A:
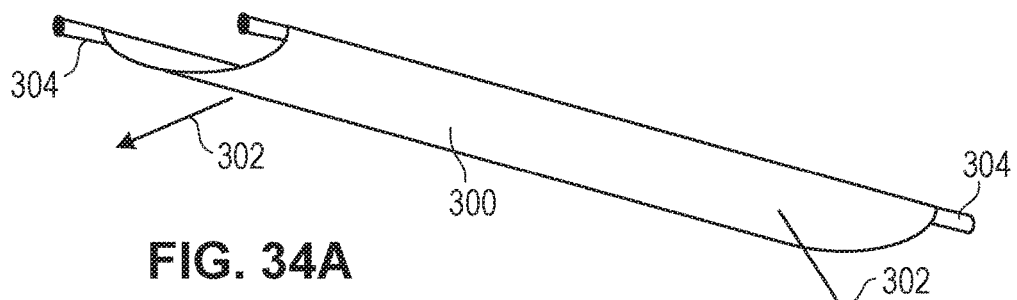
FIG. 34A illustrates an extended, self-supporting light strip that may be rolled up.
Figure 34B:
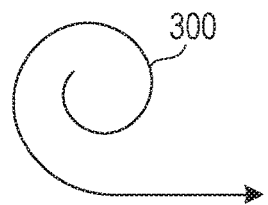
FIG. 34B illustrates the light strip of FIG. 34A rolled up.

FIG. 34A illustrates a light strip 300 mounted on a curved metal backing that can be rolled up similar to a conventional metal tape measure. The metal may be the same steel as used in a tape measure or any planar material with the ability to spring into shape. FIG. 34B is a side view of the light strip 300 rolled up. The metal backing provides strength to the strip 300 when it is unrolled, due to its U-shape, so the strip can be self supported up to 8 feet. The light emission 302 may be broad due to the curved shape of the light strip 300. Electrodes 304 project from the strip 300 and may connect to a standard fluorescent bulb socket. A metal backing is not necessary, and other material may be used, such as plastic. If the light strip is suitably formed, no backing material may be necessary.

The light strip 300 may be a lamp for installing in a fixture or may be the complete fixture itself. As a complete fixture, the light strip may be any width, such as up to one foot wide or wider, to be self-supporting. For the light strip 300 to be a fixture in itself, the electrodes 304 are attach to end caps, which are supported by wires connected to a ceiling or supported by a T-bar grid. The supporting wires carry the current, or separate wires carry the current. The strip 300 may be arced up or down, depending on the desired light distribution.

It is estimated, that the light strip 300 may be self-supporting up to 12-16 feet if it has sufficient width. LEDs may be mounted on both sides of the strip to provide bidirectional lighting where the ceiling is also illuminated. This invention greatly reduces the packaging and volume inherent in the shipping of typical planar light sources since it is readily rolled up and delivered to site in a compact fashion saving significantly in packaging and delivery costs. The use of raw materials is also significantly enhanced as far less mass is consumed by this structure to provide a given amount and distribution of lighting within the space.

In another embodiment, the U-shape is inverted, and the LEDs may be mounted on both sides if the strip.

In another embodiment, the U shape is joined back to back with another U shape such that the cross section is a free-form sprung "eyeball" type shape.

In another embodiment, the strip 300 does not have to be rollable, but may be stackable for storage. This greatly simplifies the construction of the strip 300 since it may be formed as a rigid piece. The strip 300 may only have one electrode 304 per end, or have both electrodes 304 at only one end.

Figure 35:
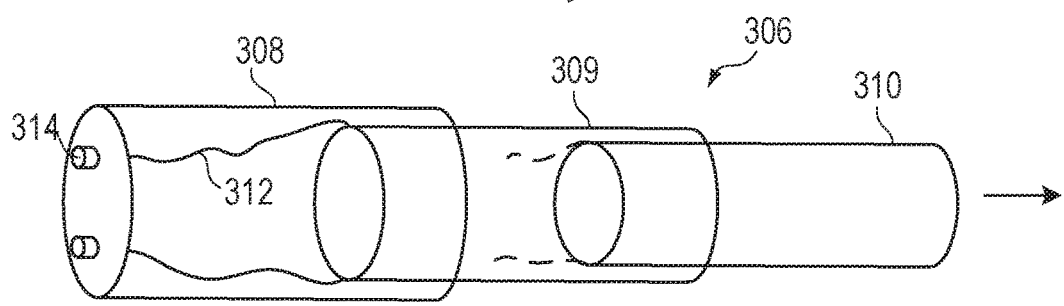
FIG. 35 illustrates a telescoping lamp formed of concentric, cylindrical light sheets.

FIG. 35 is a perspective view of a cylindrical lamp 306 formed of various sections 308, 309, 310 of light sheets, where each light sheet contains an array of LEDs and bent to form a cylinder. The lamp 306 telescopes due to the sections 309 and 310 having progressively smaller diameters. The electrodes for each section are connected by wires 312 to the lamp electrodes 314. Other means of electrical conduction may be used. Electrodes may be at both ends of the lamp 306. The lamp 306 may be fully extended or partially extended. If partially extended, light from an inner light sheet will emit through the outer light sheet since the light sheets may be transparent. In one embodiment, there are four sections of about one foot each to replace a four foot fluorescent bulb. The lamp 306 may be used to replace a variety of lamp lengths and wattages, such as 2, 3, or 4 foot lamps.

Figure 36:
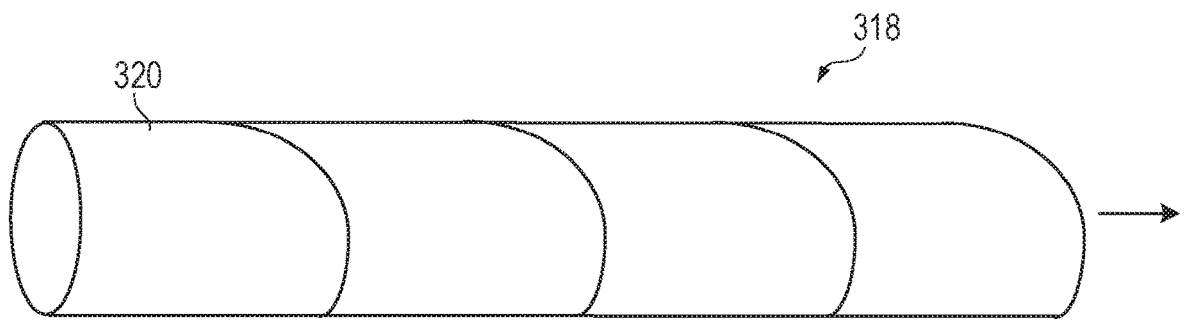
FIG. 36 illustrates a lamp formed of a spiraling light strip.

FIG. 36 illustrates a lamp 318 that is formed of a single spiral light strip 320 that is stretched into its fully expanded position shown in FIG. 36. The edges of the light sheet are shown forming a helix. The spiral may effectively lock in place by tabs or other means. For example, if one edge of the spiral strip has a U-shaped edge that corresponds to the thickness of the other side of the strip then it will naturally snap back into the U channel as the spiral is unfurled. Once snapped back the spiral will effectively be a rigid tube similar to a cardboard spiral tube used as a mandrel for winding paper. Electrodes (not shown) may protrude from one or both ends.

Figure 37A:
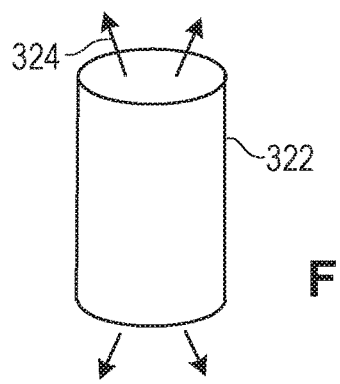
FIG. 37A illustrates a cylindrical lamp formed of a light sheet, where the LEDs are facing inward.

FIG. 37A illustrates a lamp formed of a light sheet 322 bent into a cylinder, where the LEDs' light emitting surfaces are facing into the cylinder. The outer surface may be reflective so all light 324 is emitted from the open ends of the cylinder. One end may be blocked by a reflective plate. The colors emitted by the LEDs are highly mixed so that the light exiting the lamp is very uniform. Such a lamp may be affixed to a wall to provide accent lighting or provide directed lighting onto a surface.

Figure 37B:
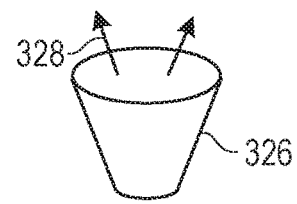
FIG. 37B illustrates a truncated cone lamp formed of a light sheet, where the LEDs are facing inward.

FIG. 37B illustrates a lamp similar to that of FIG. 37A, where the light sheet 326 is bent to form a truncated cone facing up or down. The light 328 is emitted through the large open end, and there is less reflection of the light before exiting compared to the embodiment of FIG. 37A. The bottom may be open or provided with a reflector.

Figure 38:
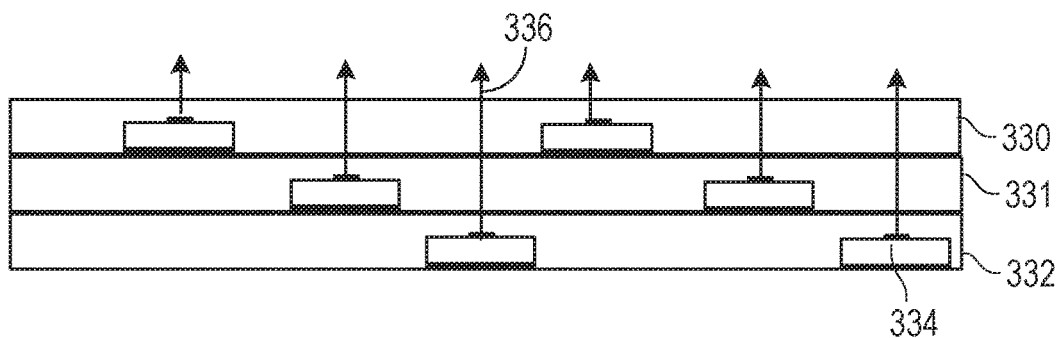
FIG. 38 is a cross-sectional view of three overlapping light sheets/strips for increasing light output per area and/or to permit mixing of different wavelengths.

FIG. 38 illustrates three overlapping light sheets/strips 330, 331, 332, each sheet/strip encapsulating an array of LEDs 334. All LEDs 334 emit light 336 in the same direction. The substrates are all transparent so as to transmit the light. Therefore, the light output per area of a lamp may be increased using this technique. Any number of sheets/strips may overlap.

The overlapping sheets/strips 330-332 may be used in any of the embodiments described herein.

In another embodiment, the three sheets/strips 330-332 may be connected to different power converter terminals. In a low light state, only one light sheet/strip (or only one set of strips) may be energized. In higher light states, the additional strips or sheets would be energized. A three-way fixture switch or other control means may be controlled by the user to apply power to the redundant strips or sheets to emulate a three-way bulb. The electrical connector for the lamp may be a standard three-way bulb connector. A mixture of strips and a sheet may also be used. In an another embodiment, the strips may be of different spectral power distributions and be independently controlled or dependently controlled by known means to provide a composite spectral power distribution. Open loop or closed loop electrical control means may provide for a variety of color temperatures or color points to be reproduced by the assembly of overlapping sheets/strips.

Figure 39:
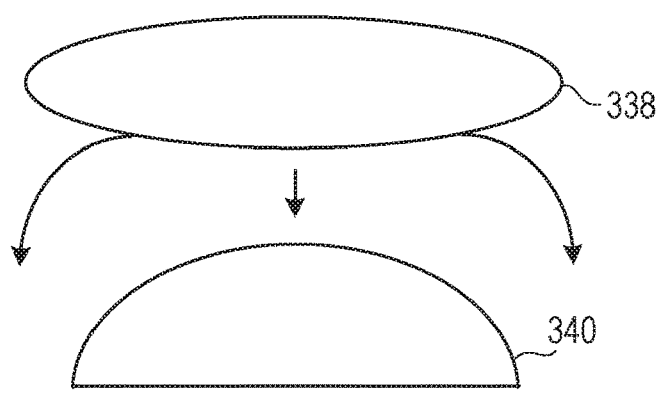
FIG. 39 illustrates a stretchable light sheet for affixing over a form, such as a shallow dome.

FIG. 39 illustrates that the substrates used to form a light sheet 338 may be stretchable so as to conform to 3-dimensional objects, such as a shallow dome 340. The LEDs in the sheet 338 may emit light in either direction. The stretchable substrate may have an adhesive surface to stick to the form.

Figure 40:
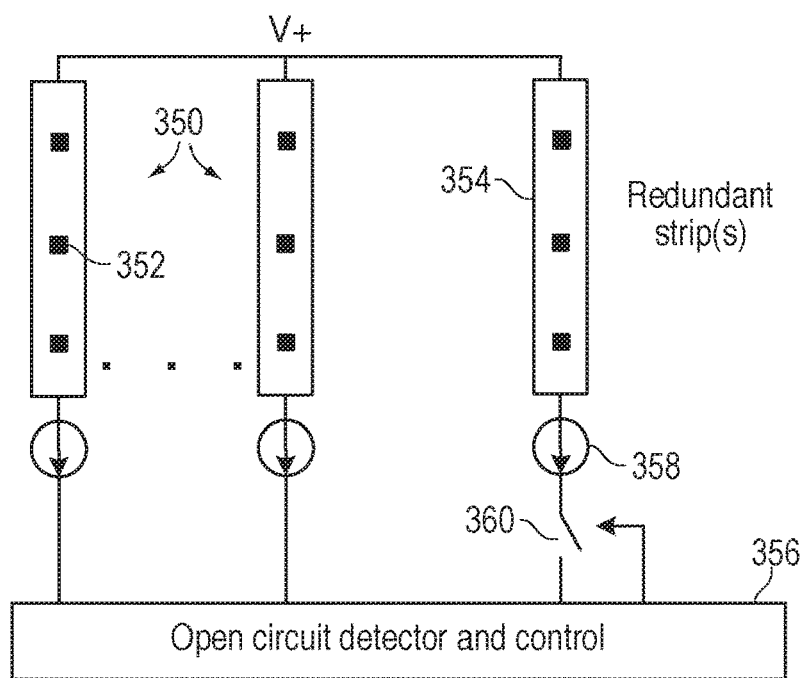
FIG. 40 illustrates a circuit for automatically energizing one or more redundant light strips when a normally energized light strip fails.

To maintain a certain brightness level over very long periods, redundant strips may be used, as shown in FIG. 40. FIG. 40 illustrates a set of active strips 350 containing LEDs 352 and one or more redundant strips 354. The active strips 350 are normally all energized. The redundant strips 354 would not be energized until an open circuit detector 356 detects that a normally operational strip has either become an open circuit or has otherwise failed. Then the detector 356 controls a current source 358, via a switch 360, to power up a redundant strip 354. Many other types of circuits may be used to detect a non-operational strip and, in turn, energize a redundant strip. A redundant strip 354 may also be energized in response to an active feedback sensor sensing that the light has dropped below a threshold level.

In another embodiment of FIG. 40, the strips may be enabled to self regulate system output by utilizing control means responsive to temperature or light flux that enable warmer strips to dim and for cooler strips to brighten such that overall efficacy and longevity is maximized. For example, the strips may be cooled by reducing a PWM duty cycle of the strips.

In another embodiment of FIG. 40, parallel strips 354 of LEDs produced with approximately equal impedance are powered and wired such that a change in the impedance of each strip is detected by the detector 356. This detection can be by monitoring the currents through the strips 354 and detecting any increase in current due to a drop in resistance of a particular LED, such as the lowering of an LED's voltage drop due to excess heat. The average current through this decreased resistance can be reduced by the detector 356 decreasing the duty cycle of the individual LED or the strip 354 which contains it. As the decreased LED or strip 354 cools, the other, parallel strips will be radiating sufficient light to keep the integrated flux constant. As other LEDs heat and drop their resistance and have their duty cycle decreased in turn by detector 356, the previously reduced strips will have cooled and their duty cycle can now be increased so that the integrated light flux remains the same. Accordingly, each strip will have its resistance monitored and current adjusted such that it cools while other parallel strips are radiating. The current can be controlled by controlling a resistance, voltage, or any other suitable parameter. This control of temperature and current through the various junctions can be arranged so that the required light flux is maintained but the degradation of the various junctions is reduced, thereby extending the life.

Accordingly, there can be no thermal runaway problems and the lifetime of each strip will be approximately the same.

The continual detection and control of each strip 354, controlled by detector 356, allows a feedback and control loop to occur that
i) detects overheating junctions through their drop in resistance;
ii) cools the overheating junctions by reducing their duty cycle;
iii) transfers the extra load to other strips operating with normal resistance;
iv) keeps constant the overall flux of light from the entire light sheet, luminaire, or device, either through statistics or through an active larger-scale control loop;
v) allows the entire device to have a substantially longer lifetime through the lengthened lifetimes of the component LEDs and LED light strips.

The various features of the lamps described herein may be combined in any way.

The inventions can be applied to any form of lamp having any type of electrical connector. The lamps may run off the mains voltage or a battery. If a battery is the power supply, the selection of the number of LEDs in a strip (determining the voltage drop) may be such that there is no power supply needed in the lamp.

Having described the invention in detail, those skilled in the art will appreciate that given the present disclosure, modifications may be made to the invention without departing from the spirit and inventive concepts described herein. Therefore, it is not intended that the scope of the invention be limited to the specific embodiments illustrated and described.

What is claimed is:

1. A solid state lamp comprising:
   a connector configured to electrically connect the solid state lamp to an external power source, the connector defining an axis; and
   a bulb portion extending along the axis and attached to the connector, the bulb portion comprising:
      a support structure extending along the axis;
      an elongate substrate extending from a first end to a second end opposite the first end, the substrate supporting a plurality of unpackaged light emitting diode (LED) dies spaced apart between the first and second ends, the plurality of LED dies being encapsulated on the substrate by an encapsulant comprising a phosphor and a binder; and
   wherein the substrate extends in a straight line and is arranged along the axis and the elongate substrate is attached to the support structure.

2. The solid state lamp of claim 1, wherein the straight line is parallel to the axis.

3. The solid state lamp of claim 1, wherein the straight line is non-parallel to the axis.

4. The solid state lamp of claim 3, wherein a radial distance of the substrate from the axis varies along the length of the substrate.

5. The solid state lamp of claim 4, wherein the radial distance increases along the substrate closer to the connector.

6. The solid state lamp of claim 1, further comprising one or more additional elongate substrates each extending from a corresponding first end to a corresponding second end opposite the first end, each substrate supporting a plurality of spaced-apart light emitting diode (LED) dies encapsulated on the substrate by an encapsulant comprising a phosphor and a binder.

7. The solid state lamp of claim 6, wherein the elongate substrate and the additional elongate substrates are arranged non-parallel to each other.

8. The solid state lamp of claim 6, wherein at least some of the elongate substrates are parallel to each other.

9. The solid state lamp of claim 6, wherein at least some of the additional elongate substrates extend along respective straight lines.

10. The solid state lamp of claim 9, wherein at least some of the additional elongate substrates extend along a respective straight line parallel to the axis.

11. The solid state lamp of claim 9, wherein at least some of the respective straight lines are non-parallel to the axis.

12. The solid state lamp of claim 6, wherein a radial distance of at least some of the elongate substrates from the axis varies along the length of the elongate substrate.

13. The solid state lamp of claim 12, wherein the radial distance increases along the substrate closer to the connector for each substrate.

14. The solid state lamp of claim 1, wherein the elongate substrate is coupled to the support structure at an end of the elongate substrate.

15. The solid state lamp of claim 14, wherein the support structure comprises a stiff rod.

16. The solid state lamp of claim 15, wherein the elongate substrate is held in place by the stiff rod.

17. The solid state lamp of claim 1, wherein the elongate substrate, the plurality of spaced-apart light emitting diode (LED) dies, and encapsulant are configured to mimic the appearance of filaments in an incandescent light bulb during operation.

18. The solid state lamp of claim 1, wherein the substrate is a flexible substrate.

19. The solid state lamp of claim 1, wherein the dies are flip-chip LED dies operatively interconnected without wire bonds.

20. The solid state lamp of claim 19, wherein the flip-chip LED dies are operatively connected via traces.

21. The solid state lamp of claim 1, wherein the elongate substrate is a light transmitting or reflecting substrate.

* * * * *